(12) United States Patent
Hadidi et al.

(10) Patent No.: US 12,214,420 B2
(45) Date of Patent: *Feb. 4, 2025

(54) SPHEROIDAL TITANIUM METALLIC POWDERS WITH CUSTOM MICROSTRUCTURES

(71) Applicant: 6K Inc., North Andover, MA (US)

(72) Inventors: Kamal Hadidi, Somerville, MA (US); Gregory M. Wrobel, North Andover, MA (US); Makhlouf Redjdal, Melrose, MA (US)

(73) Assignee: 6K Inc., North Andover, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/061,250

(22) Filed: Dec. 2, 2022

(65) Prior Publication Data

US 2023/0211407 A1 Jul. 6, 2023

Related U.S. Application Data

(63) Continuation of application No. 17/301,880, filed on Apr. 16, 2021, now Pat. No. 11,577,314, which is a
(Continued)

(51) Int. Cl.
*B22F 9/14* (2006.01)
*B22F 1/00* (2022.01)
*B22F 1/065* (2022.01)
*B22F 1/142* (2022.01)
*B22F 9/08* (2006.01)
(Continued)

(52) U.S. Cl.
CPC ............... *B22F 1/00* (2013.01); *B22F 1/065* (2022.01); *B22F 1/142* (2022.01); *B22F 9/08* (2013.01); *B22F 9/14* (2013.01); *B22F 9/30* (2013.01); *H01J 37/32192* (2013.01); *H05H 1/26* (2013.01); *H05H 1/30* (2013.01); *H05H 1/42* (2013.01); *B22F 2207/11* (2013.01); *B22F 2998/10* (2013.01); *B22F 2999/00* (2013.01)

(58) Field of Classification Search
None
See application file for complete search history.

(56) References Cited

U.S. PATENT DOCUMENTS

| 1,699,205 | A | 1/1929 | Emil et al. |
| 2,892,215 | A | 6/1959 | Gerhard et al. |

(Continued)

FOREIGN PATENT DOCUMENTS

| AU | 2003211869 A1 | 9/2003 |
| AU | 2014394102 B2 | 6/2020 |

(Continued)

OTHER PUBLICATIONS

"Build Boldly", Technology Demonstration, 6K Additive, [publication date unknown], in 11 pages.
(Continued)

*Primary Examiner* — George Wyszomierski
(74) *Attorney, Agent, or Firm* — Knobbe, Martens, Olson & Bear, LLP

(57) ABSTRACT

Methodologies, systems, and devices are provided for producing metal spheroidal powder products. By utilizing a microwave plasma, control over spheroidization and resulting microstructure can be tailored to meet desired demands.

17 Claims, 7 Drawing Sheets

Related U.S. Application Data continuation of application No. 16/012,370, filed on Jun. 19, 2018, now Pat. No. 10,987,735, which is a continuation-in-part of application No. 15/381,336, filed on Dec. 16, 2016, now Pat. No. 11,148,202.

(60) Provisional application No. 62/268,186, filed on Dec. 16, 2015.

(51) Int. Cl.
| | |
|---|---|
| B22F 9/30 | (2006.01) |
| H01J 37/32 | (2006.01) |
| H05H 1/26 | (2006.01) |
| H05H 1/30 | (2006.01) |
| H05H 1/42 | (2006.01) |

(56) References Cited

U.S. PATENT DOCUMENTS

| | | |
|---|---|---|
| 3,290,723 A | 12/1966 | John et al. |
| 3,293,334 A | 12/1966 | Bylund et al. |
| 3,434,831 A | 3/1969 | Knopp |
| 3,466,165 A | 9/1969 | Rhys et al. |
| RE26,879 E | 5/1970 | Kelso |
| 3,652,259 A | 3/1972 | Knopp |
| 3,802,816 A | 4/1974 | Kaufmann |
| 3,845,344 A | 10/1974 | Rainer |
| 3,909,241 A | 9/1975 | Cheney et al. |
| 3,966,374 A | 6/1976 | Honnorat et al. |
| 3,974,245 A | 8/1976 | Cheney et al. |
| 4,076,640 A | 2/1978 | Forgensi et al. |
| 4,177,026 A | 12/1979 | Honnorat et al. |
| 4,212,837 A | 7/1980 | Kubo et al. |
| 4,221,554 A | 9/1980 | Oguchi et al. |
| 4,221,775 A | 9/1980 | Anno |
| 4,423,303 A | 12/1983 | Hirose et al. |
| 4,431,449 A | 2/1984 | Dillon et al. |
| 4,439,410 A | 3/1984 | Santen et al. |
| 4,544,404 A | 10/1985 | Yolton et al. |
| 4,569,823 A | 2/1986 | Westin |
| 4,599,880 A | 7/1986 | Stepanenko et al. |
| 4,611,108 A | 9/1986 | Leprince et al. |
| 4,670,047 A | 6/1987 | Kopatz et al. |
| 4,692,584 A | 9/1987 | Caneer, Jr. |
| 4,705,560 A | 11/1987 | Kemp et al. |
| 4,711,660 A | 12/1987 | Kemp et al. |
| 4,711,661 A | 12/1987 | Kemp et al. |
| 4,714,587 A | 12/1987 | Eylon et al. |
| 4,731,110 A | 3/1988 | Kopatz et al. |
| 4,731,111 A | 3/1988 | Kopatz et al. |
| 4,772,315 A | 9/1988 | Johnson et al. |
| 4,778,515 A | 10/1988 | Kemp et al. |
| 4,780,131 A | 10/1988 | Kemp et al. |
| 4,783,216 A | 11/1988 | Kemp et al. |
| 4,783,218 A | 11/1988 | Kemp et al. |
| 4,787,934 A | 11/1988 | Johnson et al. |
| 4,802,915 A | 2/1989 | Kopatz et al. |
| 4,836,850 A | 6/1989 | Kemp et al. |
| 4,859,237 A | 8/1989 | Johnson et al. |
| 4,923,509 A | 5/1990 | Kemp et al. |
| 4,943,322 A | 7/1990 | Kemp et al. |
| 4,944,797 A | 7/1990 | Kemp et al. |
| 4,952,389 A | 8/1990 | Szymanski et al. |
| 5,041,713 A | 8/1991 | Weidman |
| 5,095,048 A | 3/1992 | Takahashi et al. |
| 5,114,471 A | 5/1992 | Johnson et al. |
| 5,131,992 A | 7/1992 | Church et al. |
| 5,200,595 A | 4/1993 | Boulos et al. |
| 5,290,507 A | 3/1994 | Runkle |
| 5,292,370 A | 3/1994 | Tsai et al. |
| 5,376,475 A | 12/1994 | Ovshinsky et al. |
| 5,411,592 A | 5/1995 | Ovshinsky et al. |
| 5,431,967 A | 7/1995 | Manthiram et al. |
| 5,518,831 A | 5/1996 | Tou et al. |
| 5,676,919 A | 10/1997 | Kawamura et al. |
| 5,750,013 A | 5/1998 | Lin |
| 5,776,323 A | 7/1998 | Kobashi |
| 5,958,361 A | 9/1999 | Laine et al. |
| 5,980,977 A | 11/1999 | Deng et al. |
| 5,989,648 A | 11/1999 | Phillips |
| 6,027,585 A | 2/2000 | Patterson et al. |
| 6,221,125 B1 | 4/2001 | Soda et al. |
| 6,261,484 B1 | 7/2001 | Phillips et al. |
| 6,274,110 B1 | 8/2001 | Kim et al. |
| 6,329,628 B1 | 12/2001 | Kuo et al. |
| 6,334,882 B1 | 1/2002 | Aaslund |
| 6,376,027 B1 | 4/2002 | Lee et al. |
| 6,409,851 B1 | 6/2002 | Sethuram et al. |
| 6,428,600 B1 | 8/2002 | Flurschuetz et al. |
| 6,543,380 B1 | 4/2003 | Sung-Spitzl |
| 6,551,377 B1 | 4/2003 | Leonhardt |
| 6,569,397 B1 | 5/2003 | Yadav et al. |
| 6,579,573 B2 | 6/2003 | Strutt et al. |
| 6,589,311 B1 | 7/2003 | Han et al. |
| 6,652,822 B2 | 11/2003 | Phillips et al. |
| 6,676,728 B2 | 1/2004 | Han et al. |
| 6,689,192 B1 | 2/2004 | Phillips et al. |
| 6,752,979 B1 | 6/2004 | Talbot et al. |
| 6,755,886 B2 | 6/2004 | Phillips et al. |
| 6,780,219 B2 | 8/2004 | Singh et al. |
| 6,793,849 B1 | 9/2004 | Gruen et al. |
| 6,805,822 B2 | 10/2004 | Takei et al. |
| 6,838,072 B1 | 1/2005 | Kong et al. |
| 6,869,550 B2 | 3/2005 | Dorfman et al. |
| 6,902,745 B2 | 6/2005 | Lee et al. |
| 6,919,257 B2 | 7/2005 | Gealy et al. |
| 6,919,527 B2 | 7/2005 | Boulos et al. |
| 6,989,529 B2 | 1/2006 | Wiseman |
| 7,066,980 B2 | 6/2006 | Akimoto et al. |
| 7,091,441 B1 | 8/2006 | Kuo |
| 7,108,733 B2 | 9/2006 | Enokido |
| 7,125,537 B2 | 10/2006 | Liao et al. |
| 7,125,822 B2 | 10/2006 | Nakano et al. |
| 7,175,786 B2 | 2/2007 | Celikkaya et al. |
| 7,182,929 B1 | 2/2007 | Singhal et al. |
| 7,220,398 B2 | 5/2007 | Sutorik et al. |
| 7,235,118 B2 | 6/2007 | Bouaricha et al. |
| 7,285,194 B2 | 10/2007 | Uno et al. |
| 7,285,307 B2 | 10/2007 | Hohenthanner et al. |
| 7,297,310 B1 | 11/2007 | Peng et al. |
| 7,297,892 B2 | 11/2007 | Kelley et al. |
| 7,344,776 B2 | 3/2008 | Kollmann et al. |
| 7,357,910 B2 | 4/2008 | Phillips et al. |
| 7,368,130 B2 | 5/2008 | Kim et al. |
| 7,374,704 B2 | 5/2008 | Che et al. |
| 7,375,303 B2 | 5/2008 | Twarog |
| 7,431,750 B2 | 10/2008 | Liao et al. |
| 7,442,271 B2 | 10/2008 | Asmussen et al. |
| 7,491,468 B2 | 2/2009 | Okada et al. |
| 7,517,513 B2 | 4/2009 | Sarkas et al. |
| 7,524,353 B2 | 4/2009 | Johnson et al. |
| 7,534,296 B2 | 5/2009 | Swain et al. |
| 7,572,315 B2 | 8/2009 | Boulos et al. |
| 7,622,211 B2 | 11/2009 | Vyas et al. |
| 7,629,553 B2 | 12/2009 | Fanson et al. |
| 7,700,152 B2 | 4/2010 | Laine et al. |
| 7,776,303 B2 | 8/2010 | Hung et al. |
| 7,806,077 B2 | 10/2010 | Lee et al. |
| 7,828,999 B2 | 11/2010 | Yubuta et al. |
| 7,901,658 B2 | 3/2011 | Weppner et al. |
| 7,931,836 B2 | 4/2011 | Xie et al. |
| 7,939,141 B2 | 5/2011 | Matthews et al. |
| 8,007,691 B2 | 8/2011 | Sawaki et al. |
| 8,043,405 B2 | 10/2011 | Johnson et al. |
| 8,092,941 B2 | 1/2012 | Weppner et al. |
| 8,101,061 B2 | 1/2012 | Suh et al. |
| 8,168,128 B2 | 5/2012 | Seeley et al. |
| 8,178,240 B2 | 5/2012 | Wang et al. |
| 8,192,865 B2 | 6/2012 | Buiel et al. |
| 8,193,291 B2 | 6/2012 | Zhang |
| 8,211,388 B2 | 7/2012 | Woodfield et al. |
| 8,268,230 B2 | 9/2012 | Cherepy et al. |
| 8,283,275 B2 | 10/2012 | Heo et al. |
| 8,303,926 B1 | 11/2012 | Luhrs et al. |

(56) References Cited

U.S. PATENT DOCUMENTS

| | | |
|---|---|---|
| 8,329,090 B2 | 12/2012 | Hollingsworth et al. |
| 8,329,257 B2 | 12/2012 | Larouche et al. |
| 8,338,323 B2 | 12/2012 | Takasu et al. |
| 8,389,160 B2 | 3/2013 | Venkatachalam et al. |
| 8,420,043 B2 | 4/2013 | Gamo et al. |
| 8,439,998 B2 | 5/2013 | Ito et al. |
| 8,449,950 B2 | 5/2013 | Shang et al. |
| 8,478,785 B2 | 7/2013 | Jamjoom et al. |
| 8,492,303 B2 | 7/2013 | Bulan et al. |
| 8,529,996 B2 | 9/2013 | Bocian et al. |
| 8,592,767 B2 | 11/2013 | Rappe et al. |
| 8,597,722 B2 | 12/2013 | Albano et al. |
| 8,623,555 B2 | 1/2014 | Kang et al. |
| 8,658,317 B2 | 2/2014 | Weppner et al. |
| 8,685,593 B2 | 4/2014 | Dadheech et al. |
| 8,728,680 B2 | 5/2014 | Mikhail et al. |
| 8,735,022 B2 | 5/2014 | Schlag et al. |
| 8,748,785 B2 | 6/2014 | Jordan et al. |
| 8,758,957 B2 | 6/2014 | Dadheech et al. |
| 8,784,706 B2 | 7/2014 | Shevchenko et al. |
| 8,822,000 B2 | 9/2014 | Kumagai et al. |
| 8,840,701 B2 | 9/2014 | Borland et al. |
| 8,877,119 B2 | 11/2014 | Jordan et al. |
| 8,911,529 B2 | 12/2014 | Withers et al. |
| 8,919,428 B2 | 12/2014 | Cola et al. |
| 8,945,431 B2 | 2/2015 | Schulz et al. |
| 8,951,496 B2 | 2/2015 | Hadidi et al. |
| 8,956,785 B2 | 2/2015 | Dadheech et al. |
| 8,968,587 B2 | 3/2015 | Shin et al. |
| 8,968,669 B2 | 3/2015 | Chen |
| 8,980,485 B2 | 3/2015 | Lanning et al. |
| 8,999,440 B2 | 4/2015 | Zenasni et al. |
| 9,023,259 B2 | 5/2015 | Hadidi et al. |
| 9,065,141 B2 | 6/2015 | Merzougui et al. |
| 9,067,264 B2 | 6/2015 | Moxson et al. |
| 9,079,778 B2 | 7/2015 | Kelley et al. |
| 9,085,490 B2 | 7/2015 | Taylor et al. |
| 9,101,982 B2 | 8/2015 | Aslund |
| 9,136,569 B2 | 9/2015 | Song et al. |
| 9,150,422 B2 | 10/2015 | Nakayama et al. |
| 9,193,133 B2 | 11/2015 | Shin et al. |
| 9,196,901 B2 | 11/2015 | Se-Hee et al. |
| 9,196,905 B2 | 11/2015 | Tzeng et al. |
| 9,206,085 B2 | 12/2015 | Hadidi et al. |
| 9,242,224 B2 | 1/2016 | Redjdal et al. |
| 9,259,785 B2 | 2/2016 | Hadidi et al. |
| 9,293,302 B2 | 3/2016 | Risby et al. |
| 9,321,071 B2 | 4/2016 | Jordan et al. |
| 9,322,081 B2 | 4/2016 | McHugh et al. |
| 9,352,278 B2 | 5/2016 | Spatz et al. |
| 9,356,281 B2 | 5/2016 | Verbrugge et al. |
| 9,368,772 B1 | 6/2016 | Chen et al. |
| 9,412,998 B2 | 8/2016 | Rojeski et al. |
| 9,421,612 B2 | 8/2016 | Fang et al. |
| 9,425,463 B2 | 8/2016 | Hsu et al. |
| 9,463,435 B2 | 10/2016 | Schulz et al. |
| 9,520,600 B2 | 12/2016 | Dadheech et al. |
| 9,624,565 B2 | 4/2017 | Lee et al. |
| 9,630,162 B1 | 4/2017 | Sunkara et al. |
| 9,643,891 B2 | 5/2017 | Hadidi et al. |
| 9,700,877 B2 | 7/2017 | Kim et al. |
| 9,705,136 B2 | 7/2017 | Rojeski |
| 9,718,131 B2 | 8/2017 | Boulos et al. |
| 9,735,427 B2 | 8/2017 | Zhang |
| 9,738,788 B1 | 8/2017 | Gross et al. |
| 9,751,129 B2 | 9/2017 | Boulos et al. |
| 9,768,033 B2 | 9/2017 | Ranjan et al. |
| 9,776,378 B2 | 10/2017 | Choi |
| 9,782,791 B2 | 10/2017 | Redjdal et al. |
| 9,782,828 B2 | 10/2017 | Wilkinson |
| 9,796,019 B2 | 10/2017 | She et al. |
| 9,796,020 B2 | 10/2017 | Aslund |
| 9,831,503 B2 | 11/2017 | Sopchak |
| 9,871,248 B2 | 1/2018 | Rayner et al. |
| 9,879,344 B2 | 1/2018 | Lee et al. |
| 9,899,674 B2 | 2/2018 | Hirai et al. |
| 9,917,299 B2 | 3/2018 | Behan et al. |
| 9,932,673 B2 | 4/2018 | Jordan et al. |
| 9,945,034 B2 | 4/2018 | Yao et al. |
| 9,947,926 B2 | 4/2018 | Kim et al. |
| 9,981,284 B2 | 5/2018 | Guo et al. |
| 9,991,458 B2 | 6/2018 | Rosenman et al. |
| 9,999,922 B1 | 6/2018 | Struve |
| 10,011,491 B2 | 7/2018 | Lee et al. |
| 10,050,303 B2 | 8/2018 | Anandan et al. |
| 10,057,986 B2 | 8/2018 | Prud'homme et al. |
| 10,065,240 B2 | 9/2018 | Chen |
| 10,079,392 B2 | 9/2018 | Huang et al. |
| 10,116,000 B1 | 10/2018 | Federici et al. |
| 10,130,994 B2 | 11/2018 | Fang et al. |
| 10,167,556 B2 | 1/2019 | Ruzic et al. |
| 10,170,753 B2 | 1/2019 | Ren et al. |
| 10,193,142 B2 | 1/2019 | Rojeski |
| 10,244,614 B2 | 3/2019 | Foret |
| 10,319,537 B2 | 6/2019 | Claussen et al. |
| 10,333,183 B2 | 6/2019 | Sloop |
| 10,350,680 B2 | 7/2019 | Yamamoto et al. |
| 10,411,253 B2 | 9/2019 | Tzeng et al. |
| 10,439,206 B2 | 10/2019 | Behan et al. |
| 10,442,000 B2 | 10/2019 | Fukada et al. |
| 10,461,298 B2 | 10/2019 | Herle |
| 10,477,665 B2 | 11/2019 | Hadidi et al. |
| 10,493,524 B2 | 12/2019 | She et al. |
| 10,522,300 B2 | 12/2019 | Yang |
| 10,526,684 B2 | 1/2020 | Ekman et al. |
| 10,529,486 B2 | 1/2020 | Nishisaka |
| 10,543,534 B2 | 1/2020 | Hadidi et al. |
| 10,593,985 B2 | 3/2020 | Sastry et al. |
| 10,610,929 B2 | 4/2020 | Fang et al. |
| 10,637,029 B2 | 4/2020 | Gotlib Vainshtein et al. |
| 10,638,592 B2 | 4/2020 | Foret |
| 10,639,712 B2 | 5/2020 | Barnes et al. |
| 10,647,824 B2 | 5/2020 | Hwang et al. |
| 10,655,206 B2 | 5/2020 | Moon et al. |
| 10,665,890 B2 | 5/2020 | Kang et al. |
| 10,668,566 B2 | 6/2020 | Smathers et al. |
| 10,669,437 B2 | 6/2020 | Cox et al. |
| 10,688,564 B2 | 6/2020 | Boulos et al. |
| 10,707,477 B2 | 7/2020 | Sastry et al. |
| 10,717,150 B2 | 7/2020 | Aleksandrov et al. |
| 10,727,477 B2 | 7/2020 | Kim et al. |
| 10,741,845 B2 | 8/2020 | Yushin et al. |
| 10,744,590 B2 | 8/2020 | Maier et al. |
| 10,756,334 B2 | 8/2020 | Stowell et al. |
| 10,766,787 B1 | 9/2020 | Sunkara et al. |
| 10,777,804 B2 | 9/2020 | Sastry et al. |
| 10,858,255 B2 | 12/2020 | Koziol et al. |
| 10,858,500 B2 | 12/2020 | Chen et al. |
| 10,892,477 B2 | 1/2021 | Choi et al. |
| 10,930,473 B2 | 2/2021 | Paukner et al. |
| 10,943,744 B2 | 3/2021 | Sungail et al. |
| 10,944,093 B2 | 3/2021 | Paz et al. |
| 10,964,938 B2 | 3/2021 | Rojeski |
| 10,987,735 B2 | 4/2021 | Hadidi et al. |
| 10,998,552 B2 | 5/2021 | Lanning et al. |
| 11,031,641 B2 | 6/2021 | Gupta et al. |
| 11,050,061 B2 | 6/2021 | Kim et al. |
| 11,072,533 B2 | 7/2021 | Shevchenko et al. |
| 11,077,524 B2 | 8/2021 | Smathers et al. |
| 11,108,050 B2 | 8/2021 | Kim et al. |
| 11,116,000 B2 | 9/2021 | Sandberg et al. |
| 11,130,175 B2 | 9/2021 | Parrish et al. |
| 11,130,994 B2 | 9/2021 | Shachar et al. |
| 11,133,495 B2 | 9/2021 | Gazda et al. |
| 11,148,202 B2 | 10/2021 | Hadidi et al. |
| 11,167,556 B2 | 11/2021 | Shimada et al. |
| 11,170,753 B2 | 11/2021 | Nomura et al. |
| 11,171,322 B2 | 11/2021 | Seol et al. |
| 11,183,682 B2 | 11/2021 | Sunkara et al. |
| 11,193,142 B2 | 12/2021 | Angelidaki et al. |
| 11,196,045 B2 | 12/2021 | Dadheech et al. |
| 11,219,884 B2 | 1/2022 | Takeda et al. |
| 11,244,614 B2 | 2/2022 | He et al. |
| 11,245,065 B1 | 2/2022 | Ouderkirk et al. |

(56) References Cited

U.S. PATENT DOCUMENTS

| | | |
|---|---|---|
| 11,245,109 B2 | 2/2022 | Tzeng et al. |
| 11,254,585 B2 | 2/2022 | Ekman et al. |
| 11,273,322 B2 | 3/2022 | Zanata et al. |
| 11,273,491 B2 | 3/2022 | Barnes et al. |
| 11,299,397 B2 | 4/2022 | Lanning et al. |
| 11,311,938 B2 | 4/2022 | Badwe et al. |
| 11,319,537 B2 | 5/2022 | Dames et al. |
| 11,333,183 B2 | 5/2022 | Desai et al. |
| 11,335,911 B2 | 5/2022 | Lanning et al. |
| 11,350,680 B2 | 6/2022 | Rutkoski et al. |
| 11,411,253 B2 | 8/2022 | Busacca et al. |
| 11,439,206 B2 | 9/2022 | Santos |
| 11,442,000 B2 | 9/2022 | Vaez-Iravani et al. |
| 11,461,298 B1 | 10/2022 | Shemmer et al. |
| 11,465,201 B2 | 10/2022 | Barnes et al. |
| 11,471,941 B2 | 10/2022 | Barnes et al. |
| 11,477,665 B2 | 10/2022 | Franke et al. |
| 11,577,314 B2 | 2/2023 | Hadidi et al. |
| 11,590,568 B2 | 2/2023 | Badwe et al. |
| 11,611,130 B2 | 3/2023 | Wrobel et al. |
| 11,633,785 B2 | 4/2023 | Badwe et al. |
| 2001/0016283 A1 | 8/2001 | Shiraishi et al. |
| 2001/0021740 A1 | 9/2001 | Lodyga et al. |
| 2002/0112794 A1 | 8/2002 | Sethuram et al. |
| 2003/0027021 A1 | 2/2003 | Sharivker et al. |
| 2003/0129497 A1 | 7/2003 | Yamamoto et al. |
| 2003/0172772 A1 | 9/2003 | Sethuram et al. |
| 2003/0186128 A1 | 10/2003 | Singh et al. |
| 2003/0207978 A1 | 11/2003 | Yadav et al. |
| 2004/0013941 A1 | 1/2004 | Kobayashi et al. |
| 2004/0045807 A1 | 3/2004 | Sarkas et al. |
| 2004/0060387 A1 | 4/2004 | Tanner-Jones |
| 2004/0123699 A1 | 7/2004 | Liao et al. |
| 2005/0025698 A1 | 2/2005 | Talbot et al. |
| 2005/0163696 A1 | 7/2005 | Uhm et al. |
| 2005/0242070 A1 | 11/2005 | Hammer |
| 2005/0260786 A1 | 11/2005 | Yoshikawa et al. |
| 2006/0040168 A1 | 2/2006 | Sridhar |
| 2006/0141153 A1 | 6/2006 | Kubota et al. |
| 2006/0145124 A1 | 7/2006 | Hsiao et al. |
| 2006/0291827 A1 | 12/2006 | Suib et al. |
| 2007/0077350 A1 | 4/2007 | Hohenthanner et al. |
| 2007/0089860 A1 | 4/2007 | Hou et al. |
| 2007/0209758 A1 | 9/2007 | Sompalli et al. |
| 2007/0221635 A1 | 9/2007 | Boulos et al. |
| 2007/0259768 A1 | 11/2007 | Kear et al. |
| 2008/0029485 A1 | 2/2008 | Kelley et al. |
| 2008/0182114 A1 | 7/2008 | Kim et al. |
| 2008/0220244 A1 | 9/2008 | Wai et al. |
| 2008/0286490 A1 | 11/2008 | Bogdanoff et al. |
| 2008/0296268 A1 | 12/2008 | Mike et al. |
| 2008/0305025 A1 | 12/2008 | Vitner et al. |
| 2009/0074655 A1 | 3/2009 | Suciu |
| 2009/0093553 A1 | 4/2009 | Kleine et al. |
| 2009/0155689 A1 | 6/2009 | Zaghib et al. |
| 2009/0202869 A1 | 8/2009 | Sawaki et al. |
| 2009/0258255 A1 | 10/2009 | Terashima et al. |
| 2009/0305132 A1 | 12/2009 | Gauthier et al. |
| 2010/0007162 A1 | 1/2010 | Han et al. |
| 2010/0096362 A1 | 4/2010 | Hirayama et al. |
| 2010/0176524 A1 | 7/2010 | Burgess et al. |
| 2011/0006254 A1 | 1/2011 | Richard et al. |
| 2012/0015284 A1 | 1/2012 | Merzougui et al. |
| 2012/0027955 A1 | 2/2012 | Sunkara et al. |
| 2012/0034135 A1 | 2/2012 | Risby |
| 2012/0048064 A1 | 3/2012 | Kasper et al. |
| 2012/0051962 A1 | 3/2012 | Imam et al. |
| 2012/0074342 A1 | 3/2012 | Kim et al. |
| 2012/0100438 A1 | 4/2012 | Fasching et al. |
| 2012/0122017 A1 | 5/2012 | Mills |
| 2012/0230860 A1 | 9/2012 | Ward-Close et al. |
| 2012/0240726 A1 | 9/2012 | Kim et al. |
| 2012/0294919 A1 | 11/2012 | Jaynes et al. |
| 2013/0032753 A1 | 2/2013 | Yamamoto et al. |
| 2013/0071284 A1 | 3/2013 | Kano et al. |
| 2013/0078508 A1 | 3/2013 | Tolbert et al. |
| 2013/0084474 A1 | 4/2013 | Mills |
| 2014/0202286 A1 | 7/2014 | Yokoyama et al. |
| 2014/0272430 A1 | 9/2014 | Kalayaraman |
| 2014/0322632 A1 | 10/2014 | Sugimoto et al. |
| 2014/0373344 A1 | 12/2014 | Takada et al. |
| 2015/0000844 A1 | 1/2015 | Woo |
| 2015/0101454 A1 | 4/2015 | Shimizu et al. |
| 2015/0167143 A1 | 6/2015 | Luce et al. |
| 2015/0171455 A1 | 6/2015 | Mills |
| 2015/0255767 A1 | 9/2015 | Aetukuri et al. |
| 2015/0259220 A1 | 9/2015 | Rosocha et al. |
| 2015/0333307 A1 | 11/2015 | Thokchom et al. |
| 2016/0028088 A1 | 1/2016 | Romeo et al. |
| 2016/0045841 A1 | 2/2016 | Kaplan et al. |
| 2016/0152480 A1 | 6/2016 | Jang et al. |
| 2016/0285090 A1 | 9/2016 | Ozkan et al. |
| 2016/0287113 A1 | 10/2016 | Hebert et al. |
| 2016/0308244 A1 | 10/2016 | Badding et al. |
| 2016/0332232 A1 | 11/2016 | Forbes et al. |
| 2016/0351910 A1 | 12/2016 | Albano et al. |
| 2017/0009328 A1 | 1/2017 | Germann et al. |
| 2017/0070180 A1 | 3/2017 | Mills |
| 2017/0113935 A1 | 4/2017 | Pennington et al. |
| 2017/0120339 A1 | 5/2017 | Aslund |
| 2017/0125842 A1 | 5/2017 | Meguro et al. |
| 2017/0151609 A1 | 6/2017 | Elsen et al. |
| 2017/0176977 A1 | 6/2017 | Huang et al. |
| 2017/0179477 A1 | 6/2017 | Walters et al. |
| 2017/0368604 A1 | 12/2017 | Wilkinson |
| 2017/0373344 A1 | 12/2017 | Hadidi et al. |
| 2018/0022928 A1 | 1/2018 | Blush |
| 2018/0083264 A1 | 3/2018 | Soppe |
| 2018/0104745 A1 | 4/2018 | L'Esperance et al. |
| 2018/0159178 A1 | 6/2018 | Weisenstein et al. |
| 2018/0169763 A1 | 6/2018 | Dorval et al. |
| 2018/0214956 A1 | 8/2018 | Larouche et al. |
| 2018/0241956 A1 | 8/2018 | Suzuki |
| 2018/0248175 A1 | 8/2018 | Ghezelbash et al. |
| 2018/0277849 A1 | 9/2018 | Gayden |
| 2018/0346344 A1 | 12/2018 | Chen et al. |
| 2018/0366707 A1 | 12/2018 | Johnson et al. |
| 2018/0375149 A1 | 12/2018 | Beck et al. |
| 2019/0001416 A1 | 1/2019 | Larouche et al. |
| 2019/0061005 A1 | 2/2019 | Kelkar |
| 2019/0084290 A1 | 3/2019 | Stoyanov et al. |
| 2019/0125842 A1 | 5/2019 | Grabowski |
| 2019/0127835 A1 | 5/2019 | Yang et al. |
| 2019/0160528 A1 | 5/2019 | McGee et al. |
| 2019/0165413 A1 | 5/2019 | Furusawa |
| 2019/0173130 A1 | 6/2019 | Schuhmacher et al. |
| 2019/0218650 A1 | 7/2019 | Subramanian et al. |
| 2019/0271068 A1 | 9/2019 | Sungail et al. |
| 2019/0292441 A1 | 9/2019 | Hill et al. |
| 2019/0334206 A1 | 10/2019 | Sastry et al. |
| 2019/0341650 A9 | 11/2019 | Lanning et al. |
| 2019/0348202 A1 | 11/2019 | Sachdev et al. |
| 2019/0362936 A1 | 11/2019 | Van Den Berg et al. |
| 2019/0389734 A1 | 12/2019 | Dietz et al. |
| 2020/0067128 A1 | 2/2020 | Chmiola et al. |
| 2020/0136176 A1 | 4/2020 | Chen |
| 2020/0153037 A1 | 5/2020 | Renna et al. |
| 2020/0198977 A1 | 6/2020 | Hof et al. |
| 2020/0203706 A1 | 6/2020 | Holman et al. |
| 2020/0207668 A1 | 7/2020 | Cavalli et al. |
| 2020/0220222 A1 | 7/2020 | Watarai et al. |
| 2020/0223704 A1 | 7/2020 | Neale et al. |
| 2020/0227728 A1 | 7/2020 | Huang et al. |
| 2020/0254432 A1 | 8/2020 | Shirman et al. |
| 2020/0276638 A1 | 9/2020 | King et al. |
| 2020/0288561 A1 | 9/2020 | Huh |
| 2020/0314991 A1 | 10/2020 | Duanmu et al. |
| 2020/0335754 A1 | 10/2020 | Ramasubramanian et al. |
| 2020/0335781 A1 | 10/2020 | Oshita et al. |
| 2020/0350565 A1 | 11/2020 | Oshita et al. |
| 2020/0358093 A1 | 11/2020 | Oshita et al. |
| 2020/0358096 A1 | 11/2020 | Paulsen et al. |
| 2020/0388857 A1 | 12/2020 | Sunkara et al. |
| 2020/0391295 A1 | 12/2020 | Dorval et al. |

(56) References Cited

U.S. PATENT DOCUMENTS

| | | |
|---|---|---|
| 2020/0395607 A1 | 12/2020 | Tzeng |
| 2020/0407858 A1 | 12/2020 | Sano et al. |
| 2021/0047186 A1 | 2/2021 | Ifuku et al. |
| 2021/0075000 A1 | 3/2021 | Holman et al. |
| 2021/0085468 A1 | 3/2021 | Ryd et al. |
| 2021/0139331 A1 | 5/2021 | Kang et al. |
| 2021/0146432 A1 | 5/2021 | Badwe et al. |
| 2021/0187614 A1 | 6/2021 | Tsubota et al. |
| 2021/0226302 A1 | 7/2021 | Lanning et al. |
| 2021/0253430 A1 | 8/2021 | Zaplotnik et al. |
| 2021/0273292 A1 | 9/2021 | Yun et al. |
| 2021/0276094 A1 | 9/2021 | Sobu et al. |
| 2021/0296731 A1 | 9/2021 | Wrobel et al. |
| 2021/0310110 A1 | 10/2021 | Stowell et al. |
| 2021/0344059 A1 | 11/2021 | Ekman et al. |
| 2021/0367264 A1 | 11/2021 | Hadidi et al. |
| 2021/0408533 A1 | 12/2021 | Holman et al. |
| 2022/0041457 A1 | 2/2022 | Pullen et al. |
| 2022/0095445 A1 | 3/2022 | Shang et al. |
| 2022/0118517 A1 | 4/2022 | Hadidi et al. |
| 2022/0127145 A1 | 4/2022 | Ding et al. |
| 2022/0134431 A1 | 5/2022 | Badwe et al. |
| 2022/0143693 A1 | 5/2022 | Larouche et al. |
| 2022/0223379 A1 | 7/2022 | Holman et al. |
| 2022/0228288 A1 | 7/2022 | Holman et al. |
| 2022/0267216 A1 | 8/2022 | Holman et al. |
| 2022/0314325 A1 | 10/2022 | Badwe |
| 2022/0324022 A1 | 10/2022 | Badwe |
| 2023/0001375 A1 | 1/2023 | Kozlowski et al. |
| 2023/0001376 A1 | 1/2023 | Kozlowski et al. |
| 2023/0032362 A1 | 2/2023 | Holman et al. |
| 2023/0144075 A1 | 5/2023 | Badwe et al. |

FOREIGN PATENT DOCUMENTS

| | | |
|---|---|---|
| CA | 2947531 A1 | 11/2015 |
| CN | 1188073 A | 7/1998 |
| CN | 1653869 A | 8/2005 |
| CN | 1675785 A | 9/2005 |
| CN | 1967911 A | 5/2007 |
| CN | 101191204 A | 6/2008 |
| CN | 101391307 A | 3/2009 |
| CN | 101728509 A | 6/2010 |
| CN | 101716686 B | 2/2011 |
| CN | 102179521 A | 9/2011 |
| CN | 102394290 A | 3/2012 |
| CN | 102412377 A | 4/2012 |
| CN | 102427130 A | 4/2012 |
| CN | 102664273 A | 9/2012 |
| CN | 102723502 A | 10/2012 |
| CN | 102867940 A | 1/2013 |
| CN | 102983312 A | 3/2013 |
| CN | 103121105 A | 5/2013 |
| CN | 103402921 A | 11/2013 |
| CN | 102554242 B | 12/2013 |
| CN | 103456926 A | 12/2013 |
| CN | 103682372 A | 3/2014 |
| CN | 103682383 A | 3/2014 |
| CN | 103700815 A | 4/2014 |
| CN | 103874538 A | 6/2014 |
| CN | 103956520 A | 7/2014 |
| CN | 104064736 A | 9/2014 |
| CN | 104084592 A | 10/2014 |
| CN | 104209526 A | 12/2014 |
| CN | 104218213 A | 12/2014 |
| CN | 204156003 U | 2/2015 |
| CN | 104485452 A | 4/2015 |
| CN | 104752734 A | 7/2015 |
| CN | 104772473 A | 7/2015 |
| CN | 103515590 B | 9/2015 |
| CN | 105514373 A | 4/2016 |
| CN | 106159316 A | 11/2016 |
| CN | 106450146 A | 2/2017 |
| CN | 106493350 A | 3/2017 |
| CN | 206040854 U | 3/2017 |
| CN | 106684387 A | 5/2017 |
| CN | 106784692 A | 5/2017 |
| CN | 107093732 A | 8/2017 |
| CN | 107579241 A | 1/2018 |
| CN | 108134104 A | 6/2018 |
| CN | 108145170 A | 6/2018 |
| CN | 108217612 A | 6/2018 |
| CN | 108649190 A | 10/2018 |
| CN | 108907210 A | 11/2018 |
| CN | 108963239 A | 12/2018 |
| CN | 109167070 A | 1/2019 |
| CN | 109301212 A | 2/2019 |
| CN | 109616622 A | 4/2019 |
| CN | 109742320 A | 5/2019 |
| CN | 109888233 A | 6/2019 |
| CN | 110153434 A | 8/2019 |
| CN | 110299516 A | 10/2019 |
| CN | 110790263 A | 2/2020 |
| CN | 110993908 A | 4/2020 |
| CN | 111099577 A | 5/2020 |
| CN | 111342163 A | 6/2020 |
| CN | 111370751 A | 7/2020 |
| CN | 111403701 A | 7/2020 |
| CN | 111515391 A | 8/2020 |
| CN | 111970807 A | 11/2020 |
| CN | 112259740 A | 1/2021 |
| CN | 112331947 A | 2/2021 |
| CN | 112397706 A | 2/2021 |
| CN | 112421006 A | 2/2021 |
| CN | 112421048 A | 2/2021 |
| CN | 112447977 A | 3/2021 |
| CN | 112768709 A | 5/2021 |
| CN | 112768710 A | 5/2021 |
| CN | 112768711 A | 5/2021 |
| CN | 112864453 A | 5/2021 |
| CN | 113097487 A | 7/2021 |
| CN | 113104838 A | 7/2021 |
| CN | 113764688 A | 12/2021 |
| CN | 113871581 A | 12/2021 |
| CN | 114388822 A | 4/2022 |
| CN | 114744315 A | 7/2022 |
| CN | 114824297 A | 7/2022 |
| CN | 115394976 A | 11/2022 |
| DE | 10335355 A1 | 11/2004 |
| DE | 102009033251 A1 | 9/2010 |
| DE | 102010006440 A1 | 8/2011 |
| DE | 102011109137 A1 | 2/2013 |
| DE | 102018132896 A1 | 6/2020 |
| EP | 0256233 A2 | 2/1988 |
| EP | 2292557 A1 | 3/2011 |
| EP | 3143838 A1 | 3/2017 |
| EP | 3474978 A1 | 5/2019 |
| FR | 2525122 A1 | 10/1983 |
| FR | 2591412 A1 | 6/1987 |
| GB | 2595745 A | 12/2021 |
| IN | 202011017775 | 10/2021 |
| JP | 10-172564 A | 6/1998 |
| JP | 11-064556 A | 3/1999 |
| JP | 2001-348296 A | 12/2001 |
| JP | 2004-505761 A | 2/2004 |
| JP | 2004-193115 A | 7/2004 |
| JP | 2004-311297 A | 11/2004 |
| JP | 2004-362895 A | 12/2004 |
| JP | 2005-015282 A | 1/2005 |
| JP | 2005-072015 A | 3/2005 |
| JP | 2005-076052 A | 3/2005 |
| JP | 2005-135755 A | 5/2005 |
| JP | 2005-187295 A | 7/2005 |
| JP | 2005-222956 A | 8/2005 |
| JP | 2005-272284 A | 10/2005 |
| JP | 2006-040722 A | 2/2006 |
| JP | 2007-113120 A | 5/2007 |
| JP | 2007-138287 A | 6/2007 |
| JP | 2007-149513 A | 6/2007 |
| JP | 2007-238402 A | 9/2007 |
| JP | 2008-230905 A | 10/2008 |
| JP | 2008-243447 A | 10/2008 |
| JP | 2009-187754 A | 8/2009 |
| JP | 2010-024506 A | 2/2010 |

(56) References Cited

FOREIGN PATENT DOCUMENTS

| | | |
|---|---|---|
| JP | 2010-097914 A | 4/2010 |
| JP | 2011-108406 A | 6/2011 |
| JP | 2011-222323 A | 11/2011 |
| JP | 2011-258348 A | 12/2011 |
| JP | 2012-046393 A | 3/2012 |
| JP | 2012-151052 A | 8/2012 |
| JP | 2013-062242 A | 4/2013 |
| JP | 2013-063539 A | 4/2013 |
| JP | 2013-076130 A | 4/2013 |
| JP | 2015-048269 A | 3/2015 |
| JP | 2015-122218 A | 7/2015 |
| JP | 2016-029193 A | 3/2016 |
| JP | 2016-047961 A | 4/2016 |
| JP | 6103499 B2 | 3/2017 |
| JP | 2017-524628 A | 8/2017 |
| JP | 2018-141762 A | 9/2018 |
| JP | 2018-190563 A | 11/2018 |
| JP | 2019-516020 A | 6/2019 |
| JP | 2020-121898 A | 8/2020 |
| JP | 2021-061089 A | 4/2021 |
| JP | 2021-061090 A | 4/2021 |
| JP | 2021-116191 A | 8/2021 |
| KR | 10-2007-0076686 A | 7/2007 |
| KR | 10-2009-0070140 A | 7/2009 |
| KR | 10-1133094 B1 | 4/2012 |
| KR | 10-2017-0039922 A | 4/2017 |
| KR | 10-2017-0045181 A | 4/2017 |
| KR | 10-2018-0001799 A | 1/2018 |
| KR | 10-2018-0035750 A | 4/2018 |
| KR | 10-1907912 B1 | 10/2018 |
| KR | 10-1907916 B1 | 10/2018 |
| KR | 10-1923466 B1 | 11/2018 |
| KR | 10-2101006 B1 | 4/2020 |
| KR | 10-2124946 B1 | 6/2020 |
| KR | 10-2020-0131751 A | 11/2020 |
| KR | 10-2021-0057253 A | 5/2021 |
| RU | 2744449 C1 | 3/2021 |
| TW | 521539 B | 2/2003 |
| TW | 200823313 A | 6/2008 |
| TW | 1329143 B | 8/2010 |
| TW | 201411922 A | 3/2014 |
| WO | 03/77333 A1 | 9/2003 |
| WO | 2004/054017 A1 | 6/2004 |
| WO | 2004/089821 A1 | 10/2004 |
| WO | 2005/039752 A1 | 5/2005 |
| WO | 2006/100837 A1 | 9/2006 |
| WO | 2010/095726 A1 | 8/2010 |
| WO | 2011/082596 A1 | 7/2011 |
| WO | 2011/090779 A2 | 7/2011 |
| WO | 2012/023858 A1 | 2/2012 |
| WO | 2012/114108 A1 | 8/2012 |
| WO | 2012/144424 A1 | 10/2012 |
| WO | 2012/162743 A1 | 12/2012 |
| WO | 2013/017217 A1 | 2/2013 |
| WO | 2014/011239 A2 | 1/2014 |
| WO | 2014/110604 A2 | 7/2014 |
| WO | 2014/153318 A1 | 9/2014 |
| WO | 2015/064633 A1 | 5/2015 |
| WO | 2015/174949 A1 | 11/2015 |
| WO | 2016/048862 A1 | 3/2016 |
| WO | 2016/091957 A1 | 6/2016 |
| WO | 2017/074081 A1 | 5/2017 |
| WO | 2017/074084 A1 | 5/2017 |
| WO | 2017/080978 A1 | 5/2017 |
| WO | 2017/091543 A1 | 6/2017 |
| WO | 2017/106601 A8 | 7/2017 |
| WO | 2017/118955 A1 | 7/2017 |
| WO | 2017/130946 A1 | 8/2017 |
| WO | 2017/158349 A1 | 9/2017 |
| WO | 2017/177315 A1 | 10/2017 |
| WO | 2017/178841 A1 | 10/2017 |
| WO | 2017/223482 A1 | 12/2017 |
| WO | 2018/133429 A1 | 7/2018 |
| WO | 2018/141082 A1 | 8/2018 |
| WO | 2019/045923 A1 | 3/2019 |
| WO | 2019/052670 A1 | 3/2019 |
| WO | 2019/095039 A1 | 5/2019 |
| WO | 2019/139773 A1 | 7/2019 |
| WO | 2019/243870 A1 | 12/2019 |
| WO | 2019/246242 A1 | 12/2019 |
| WO | 2019/246257 A1 | 12/2019 |
| WO | 2020/009955 A1 | 1/2020 |
| WO | 2020/041767 A1 | 2/2020 |
| WO | 2020/041775 A1 | 2/2020 |
| WO | 2020/091854 A1 | 5/2020 |
| WO | 2020/132343 A1 | 6/2020 |
| WO | 2020/223358 A1 | 11/2020 |
| WO | 2020/223374 A1 | 11/2020 |
| WO | 2021/029769 A1 | 2/2021 |
| WO | 2021/046249 A1 | 3/2021 |
| WO | 2021/085670 A1 | 5/2021 |
| WO | 2021/115596 A1 | 6/2021 |
| WO | 2021/118762 A1 | 6/2021 |
| WO | 2021/127132 A1 | 6/2021 |
| WO | 2021/191281 A1 | 9/2021 |
| WO | 2021/245410 A1 | 12/2021 |
| WO | 2021/245411 A1 | 12/2021 |
| WO | 2021/263273 A1 | 12/2021 |
| WO | 2022/005999 A1 | 1/2022 |
| WO | 2022/032301 A1 | 2/2022 |
| WO | 2022/043701 A1 | 3/2022 |
| WO | 2022/043702 A1 | 3/2022 |
| WO | 2022/043704 A1 | 3/2022 |
| WO | 2022/043705 A1 | 3/2022 |
| WO | 2022/067303 A1 | 3/2022 |
| WO | 2022/075846 A1 | 4/2022 |
| WO | 2022/107907 A1 | 5/2022 |
| WO | 2022/133585 A1 | 6/2022 |
| WO | 2022/136699 A1 | 6/2022 |

OTHER PUBLICATIONS

"High-entropy alloy", Wikipedia, webpage last edited Dec. 29, 2022 (accessed Jan. 17, 2023), in 16 pages. URL: https://en.wikipedia.org/wiki/High-entropy_alloy.

Ajayi, B. et al., "A rapid and scalable method for making mixed metal oxide alloys for enabling accelerated materials discovery", Journal of Materials Research, Jun. 2016, vol. 31, No. 11, pp. 1596-1607.

Ajayi, B. P. et al., "Atmospheric plasma spray pyrolysis of lithiated nickel-manganese-cobalt oxides for cathodes in lithium ion batteries", Chemical Engineering Science, vol. 174, Sep. 14, 2017, pp. 302-310.

Ali, M. et al., Spray Flame Synthesis (SFS) of Lithium Lanthanum Zirconate (LLZO) Solid Electrolyte, Materials, vol. 14, No. 13, 2021, pp. 1-13.

Australian Office Action, re AU Application No. 2016370962, mailed May 29, 2020.

Barbis et al., "Titanium powders from the hydride-dehydride process." Titanium Powder Metallurgy. Butterworth-Heinemann, 2015. pp. 101-116.

Bardos, L., et al., "Differences between microwave and RF activation of nitrogen for the PECVD process", J. Phys. D: Appl. Phys., vol. 15, 1982, pp. 79-82.

Bardos, L., et al., "Microwave Plasma Sources and Methods in Processing Technology", IEEE Press, 2022, 10 pages.

Bobzin, K. et al., "Modelling and Diagnostics of Multiple Cathodes Plasma Torch System for Plasma Spraying", Frontiers of Mechanical Engineering, Sep. 2011, vol. 6, pp. 324-331.

Bobzin, K. et al., "Numerical and Experimental Determination of Plasma Temperature during Air Plasma Spraying with a Multiple Cathodes Torch", Journal of Materials Processing Technology, Oct. 2011, vol. 211, pp. 1620-1628.

Boulos, M. I., "The inductively coupled radio frequency plasma." Journal of High Temperature Material Process, Jan. 1997, vol. 1, pp. 17-39.

Boulos, M., "Induction Plasma Processing of Materials for Powders, Coatings, and Near-Net-Shape Parts", Advanced Materials & Processes, Aug. 2011, pp. 52-53, in 3 pages.

(56) References Cited

OTHER PUBLICATIONS

Boulos, M., "Plasma power can make better powders", Metal Powder Report, May 2004, vol. 59(5), pp. 16-21.
Canadian Office Action, re CA Application No. 3009630 mailed Oct. 19, 2022.
Carreon, H. et al., "Study of Aging Effects in a Ti—6Al—4V alloy with Widmanstatten and Equiaxed Microstructures by Nondestructive Means", AIP Conference Proceedings 1581, 2014 (published online Feb. 17, 2015), pp. 739-745.
Chang, S. et al., "One-Step Fast Synthesis of Li4Ti5O12 Particles Using an Atmospheric Pressure Plasma Jet", Journal of the American Ceramic Society, Dec. 26, 2013, vol. 97, No. 3, pp. 708-712.
Chen, G. et al., "Spherical Ti—6Al—4V Powders Produced by Gas Atomization", Key Engineering Materials, vol. 704, Aug. 2016, pp. 287-292. URL: https://www.scientific.net/KEM.704.287.
Chikumba et al., "High Entropy Alloys: Development and Applications" 7th International Conference on Latest Trends in Engineering & Technology (ICLTET'2015) Nov. 26-27, 2015 Irene, Pretoria (South Africa).
Chinese Office Action, re CN Application No, 201680082035.1, mailed Sep. 2, 2020.
Chinese Office Action, re CN Application No. 201680082035.1, mailed Mar. 11, 2021.
Chinese Office Action, re CN Application No. 201680082035.1, mailed Sep. 7, 2021.
Choi, S. I., et al., "Continuous process of carbon nanotubes synthesis by decomposition of methane using an arc-jet plasma", Thin Solid Films, 2006, vol. 506-507, 2006, pp. 244-249.
Coldwell, D. M. et al., "The reduction of SiO.sub.2 with Carbon in a Plasma", Journal of Electrochemical Society, Jan. 1977, vol. 124, pp. 1686-1689.
Collin, J. E., et al., "Ionization of methane and it's electronic energy levels", Canadian Journal of Chemistry, 2011, vol. 45, No. 16, pp. 1875-1882.
Dearmiti, C., "26. Functional Fillers for Plastics", in Applied Plastics Engineering Handbook—Processing and Materials, ed., Myer Kuiz, Elsevier, 2011, pp. 455-468.
Decker, J., et al., "Sample preparation protocols for realization of reproducible characterization of single-wall carbon nanotubes", Metrologia, 2009, vol. 46, No. 6, pp. 682-692.
Ding, F., et al., "Nucleation and Growth of Single-Walled Carbon Nanotubes: A Molecular Dynamics Study", J. Phys. Chem. B, vol. 108, 2004, pp. 17369-17377.
Ding, F., et al., "The Importance of Strong Carbon-Metal Adhesion for Catalytic Nucleation of Single-Walled Carbon Nanotubes", Nano Letters, 2008, vol. 8, No. 2, pp. 463-468.
Dolbec, R., "Recycling Spherical Powders", Presented at Titanium 2015, Orlando, FL, Oct. 2015, in 20 pages.
Dors, M., et al., "Chemical Kinetics of Methane Pyrolysis in Microwave Plasma at Atmospheric Pressure", Plasma Chem Plasma Process, 2013, vol. 34, No. 2, pp. 313-326.
Eremin, A., et al., "The Role of Methyl Radical in Soot Formation", Combustion Science and Technology, vol. 191, No. 12, 2008, pp. 2226-2242.
European Office Action, re EP Application No. 16876747.3, dated Jan. 26, 2021.
European Office Action, re EP Application No. 16876747.3, dated Jun. 12, 2019.
European Office Action, re EP Application No. 16876747.3, dated May 18, 2020.
European Office Action, re EP Application No. 16876747.3, dated Sep. 8, 2021.
European Office Action, re EP Application No. 17816316.8, dated Feb. 5, 2020.
European Office Action, re EP Application No. 18923334.9, dated Dec. 12, 2022.
European Office Action, re EP Application No. 18923334.9, dated Dec. 9, 2021.
European Office Action, re EP Application No. 19735153.9, dated Dec. 12, 2022, 11 pages.
European Office Action, re EP Application No. 19740115, dated Mar. 2, 2023, 6 pages.
Finckle, J. R., et al., "Plasma Pyrolysis of Methane to Hydrogen and Carbon Black", Industrial Engineering and Chemical Research, 2002. vol. 41, No. 6, 2002, pp. 1425-1435.
Fu, D., et al., "Direct synthesis of Y-junction carbon nanotubes by microwave-assisted pyrolysis of methane", Materials Chemistry and Physics, vol. 118, vol. 2-3, 2009, pp. 501-505.
Fuchs, G.E. et al., "Microstructural evaluation of as-solidified and heat-treated y-TiAl based powders", Materials Science and Engineering, 1992, A152, pp. 277-282.
Gleiman, S. et al., "Melting and spheroidization of hexagonal boron nitride in a microwave-powered, atmospheric pressure nitrogen plasma", Journal of Materials Science, Aug. 2002, vol. 37(16), pp. 3429-3440.
Grace, J. et al., "Connecting particle sphericity and circularity", Particuology, vol. 54, 2021, pp. 1-4, ISSN 1674-2001, https://doi.org/10.1016/j.partic.2020.09.006. (Year: 2020).
Gradl, P. et al., "GRCop-42 Development and Hot-fire Testing Using Additive Manufacturing Powder Bed Fusion for Channel-Cooled Combustion Chambers", 55th AIAA/SAE/ASEE Joint Propulsion Conference 2019, Aug. 2019, pp. 1-26.
Haghighatpanah, S., et al., "Computational studies of catalyst-free single walled carbon nanotube growth", J Chem Phys, vol. 139, No. 5, 10 pages, Aug. 6, 2013.
Haneklaus, N., et al., "Stop Smoking—Tube-In-Tube Helical System for Flameless Calcination of Minerals," Processes, vol. 5, No. 4, Nov. 3, 2017, pp. 1-12.
He et al., "A precipitation-hardened high-entropy alloy with outstanding tensile properties" Acta Materialia 102, Jan. 2016, pp. 187-196.
Suryanarayana, C. et al., "Rapid solidification processing of titanium alloys", International Materials Reviews, 1991, vol. 36, pp. 85-123.
Suryanarayana, C., "Recent Developments in Mechanical Alloying", Reviews on Advanced Materials Science, Aug. 2008, vol. 18(3), pp. 203-211.
Tang, H. P. et al., "Effect of Powder Reuse Times on Additive Manufacturing of Ti—6Al—4V by Selective Electron Beam Melting", JOM, Mar. 2015, vol. 67, pp. 555-563.
Van Laar, J. H. et al., "Spheroidization of Iron Powder in a Microwave Plasma Reactor", Journal of the Southern African Institute of Mining and Metallurgy, Oct. 2016, vol. 116, No. 10, pp. 941-946.
Veith, M. et al., "Low temperature synthesis of nanocrystalline Y3Al5O12 (YAG) and Ce-doped Y3Al5O12 via different sol-gel methods." J. Mater Chem, (1999) 9: 3069-3079.
Walter et al., "Microstructural and mechanical characterization of sol gel-derived Si—O—C glasses" Journal of the European Ceramic Society, vol. 22, Issue 13, Dec. 2002, pp. 2389-2400.
Wang, H., et al., "A detailed kinetic modeling study of aromatics formation in laminar premixed acetylene and ethylene flames" Combustion and Flame, vol. 110, No. 1-2, 1997, pp. 173-221.
Wang, J. et al., "Preparation of Spherical Tungsten and Titanium Powders by RF Induction Plasma Processing", Rare Metals, Jun. 2015 (published online May 31, 2014), vol. 34, No. 6, pp. 431-435.
Wang, Y. et al., "Developments in Nanostructured Cathode Materials for High-Performance Lithium-Ion Batteries", Advanced Materials, Jun. 2008, pp. 2251-2269.
Yang et al., "Preparation of Spherical Titanium Powders from Polygonal Titanium Hydride Powders by Radio Frequency Plasma Treatment" Materials Transactions, vol. 54, No. 12 (2013) pp. 2313 to 2316.
Zavilopulo, A. N., et al., "Ionization and Dissociative Ionization of Methane Molecules", Technical Physics, vol. 58, No. 9, 2013, pp. 1251-1257.
Zeng, X., et al., "Growth and morphology of carbon nanostructures by microwave-assisted pyrolysis of methane", Physica E., vol. 42, No. 8, 2010, pp. 2103-2108.
Zhang, K., Ph.D., "The Microstructure and Properties of Hipped Powder Ti Alloys", a thesis submitted to The University of Birmingham, College of Engineering and Physical Sciences, Apr. 2009, in 65 pages.

(56) References Cited

OTHER PUBLICATIONS

Zhang et al. "High thickness tungsten coating with low oxygen content prepared by air plasma spray". Cailliao Gongcheng. (2014) (5) 23-28 {Year: 2014}.

Zhang et al., Microstructures and properties of high-entropy alloys, Progress in Materials Science, vol. 61, 2013, pp. 1-93.

Zhang, H., et al., "Plasma activation of methane for hydrogen production in a N2 rotating gliding arc warm plasma: A chemical kinetics study", Chemical Engineering Journal, vol. 345, 2018, pp. 67-78.

Zhang, J., et al., "Flexible and ion-conducting membrane electrolytes for solid-state lithium batteries: Dispersion of garnet nanoparticles in insulating polyethylene oxide", Nano Energy, vol. 28, 2016, pp. 447-454.

Zhang, Y. D. et al., "High-energy cathode materials for Li-ion batteries: A review of recent developments", Science China Technological Sciences, Sep. 2015, vol. 58(11), pp. 1809-1828.

Zhang, Y. S. et al., "Core-shell structured titanium-nitrogen alloys with high strength, high thermal stability and good plasticity", Scientific Reports, Jan. 2017, vol. 7, in 8 pages.

Zhong, R., et al., "Continuous preparation and formation mechanism of few-layer graphene by gliding arc plasma", Chemical Engineering Journal, vol. 387, 2020, 10 pages.

Zielinski, A et al., "Modeling and Analysis of a Dual-Channel Plasma Torch in Pulsed Mode Operation For Industrial Space, and Launch Applications", IEEE Transactions on Plasma Science, Jul. 2015, vol. 43(7), pp. 2201-2206.

Houmes et al., "Microwave Synthesis of Ternary Nitride Materials", Journal of Solid State Chemistry, vol. 130, Issue 2, May 1997, pp. 266-271.

Huo, H., et al., "Composite electrolytes of polyethylene oxides/garnets interfacially wetted by ionic liquid for room-temperature solid-state lithium battery", Journal of Power Sources, vol. 372, 2017, pp. 1-7.

International Preliminary Report on Patentability and Written Opinion, re PCT Application No. PCT/US2016/067100, mailed Jun. 28, 2018.

International Preliminary Report on Patentability and Written Opinion, re PCT Application No. PCT/US2019/037956, mailed Dec. 30, 2020.

International Search Report and Written Opinion, re PCT Application No. PCT/2020/065536, mailed Mar. 5, 2021.

International Search Report and Written Opinion, re PCT Application No. PCT/IB2018/054523, mailed Nov. 2, 2018.

International Search Report and Written Opinion, re PCT Application No. PCT/US2016/067100, mailed Mar. 22, 2017.

International Search Report and Written Opinion, re PCT Application No. PCT/US2017/039049, mailed on Oct. 31, 2017.

International Search Report and Written Opinion, re PCT Application No. PCT/US2019/037956, mailed Oct. 1, 2019.

International Search Report and Written Opinion, re PCT Application No. PCT/US2019/037979, mailed Aug. 22, 2019.

Irle, S., et al., "Milestones in molecular dynamics simulations of single-walled carbon nanotube formation: A brief critical review", Nano Research, 2009, vol. 2, No. 10, pp. 755-767.

Ivasishin, et al., "Innovative Process for Manufacturing Hydrogenated Titanium Powder for Solid State Production of R/M Titanium Alloy Components" Titanium 2010, Oct. 3-6, 2010, 27 pages.

Japanese Office Action, re JP Application No. 2022-537613, dated Apr. 18, 2023, 9 pages.

Jasek, O., et al., "Microwave plasma-based high temperature dehydrogenation of hydrocarbons and alcohols as a single route to highly efficient gas phase synthesis of freestanding graphene", Nanotechnology, 2021, vol. 32, 11 pages.

Jasinski, M., et al., "Atmospheric pressure microwave plasma source for hydrogen production", International Journal of Hydrogen Energy, vol. 38, Issue 26, 2013, pp. 11473-11483.

Jasinski, M., et al., "Hydrogen production via methane reforming using various microwave plasma sources", Chem. Listy, 2008, vol. 102, pp. s1332-s1337.

Jia, H. et al., "Hierarchical porous silicon structures with extraordinary mechanical strength as high-performance lithium-ion battery anodes", Nature Communications, Mar. 2020, vol. 11, in 9 pages. URL: https://doi.ora/10.1038/s41467-020-15217-9.

Kassel, L. S., "The Thermal Decomposition of Methane", Journal of the American Chemical Society, vol. 54, No. 10, 1932, pp. 3949-3961.

Kerscher, F., et al., "Low-carbon hydrogen production via electron beam plasma methane pyrolysis: Techno-economic analysis and carbon footprint assessment", International Journal of Hydrogen Energy, vol. 46, Issue 38, 2021, pp. 19897-19912.

Kim, K. S., et al., "Synthesis of single-walled carbon nanotubes by induction thermal plasma", Nano Research, 2009, vol. 2, No. 10, pp. 800-817.

Ko, M. et al., "Challenges in Accommodating Volume Change of Si Anodes for Li-Ion Batteries", Chem Electro Chem, Aug. 2015, vol. 2, pp. 1645-1651. URL: https://doi.org/10.1002/celc.201500254.

Kotlyarov, V. I. et al, "Production of Spherical Powders on the Basis of Group IV Metals for Additive Manufacturing", Inorganic Materials: Applied Research, Pleiades Publishing, May 2017, vol. 8, No. 3, pp. 452-458.

Kumal, R. R., et al., "Microwave Plasma Formation of Nanographene and Graphitic Carbon Black", C, 2020, vol. 6, No. 4, 10 pages.

Laine, R. M. et al., "Making nanosized oxide powders from precursors by flame spray pyrolysis", Key Engineering Materials, Jan. 1999, vol. 159-160, pp. 17-24.

Lee, D. H., et al., "Comparative Study of Methane Activation Process by Different Plasma Sources", Plasma Chem. Plasma Process., vol. 33, No. 4, 2013, pp. 647-661.

Lee, D. H., et al., "Mapping Plasma Chemistry in Hydrocarbon Fuel Processing Processes", Plasma Chem. Plasma Process., vol. 33, No. 1, 2013, pp. 249-269.

Li, L. et al., "Spheroidization of silica powders by radio frequency inductively coupled plasma with Ar—H2 and Ar—N2 as the sheath gases at atmospheric pressure", International Journal of Minerals, Metallurgy, and Materials, Sep. 2017, vol. 24(9), pp. 1067-1074.

Li, X. et al., "Mesoporous silicon sponge as an anti-pulverization structure for high-performance lithium-ion battery anodes", Nature Communications, Jul. 2014, vol. 5, Article No. 4105, in 7 pages. URL: httDs://doi.orq/10.1038/ncomms5105.

Li, Z. et al., "Strong and Ductile Non-Equiatomic High-Entropy Alloys: Design, Processing, Microstructure, and Mechanical Properties", The Journal of the Minerals, Metals & Materials Society, Aug. 2017, vol. 69(1), pp. 2099-2106. URL: https://doi.org/10.1007/s11837-017-2540-2.

Lin, M., "Gas Quenching with Air Products' Rapid Gas Quenching Gas Mixture", Air Products, Dec. 31, 2007, in 4 pages. URL: https://www.airproducts.co.uk/-/media/airproducts/files/en/330/330-07-085-us-gas-quenching-with-air-products-rapid-gas-quenching-gas-mixture.pdf.

Liu, Y., et al., "Advances of microwave plasma-enhanced chemical vapor deposition in fabrication of carbon nanotubes: a review", J Mater Sci., vol. 55, 2021, pp. 12559-12583.

Majewksi, T., "Investigation of W—Re—Ni heavy alloys produced from plasma spheroidized powders", Solid State Phenomena, Mar. 2013, vol. 199, pp. 448-453.

Moisan, M. et al., "Waveguide-Based Single and Multiple Nozzle Plasma Torches: the Tiago Concept", Plasma Sources Science and Technology, Jun. 2001, vol. 10, pp. 387-394.

Moldover, M. R. et al., "Measurement of the Universal Gas Constant R Using a Spherical Acoustic Resonator", Physical Review Letters, Jan. 1988, vol. 60(4), pp. 249-252.

Muoio, C. et al., "Phase Homogeneity in Y2O3—MgO Nanocomposites Synthesized by Thermal Decomposition of Nitrate Precursors with Ammonium Acetate Additions" J_ Am. Ceram. Soc., 94[12] 4207-4217, 2011.

Murugan et al. "Nanostructured a/ß-tungsten by reduction of WO3 under microwave plasma", Int. Journal of Refractory Metals and Hard Materials 29 (2011) 128-133. (Year: 2011).

Nichols, F. A., "On the spheroidization of rod-shaped particles of finite length", Journal of Materials Science, Jun. 1976, vol. 11, pp. 1077-1082.

(56) References Cited

OTHER PUBLICATIONS

Nyutu, E. et al., "Ultrasonic Nozzle Spray in Situ Mixing and Microwave-Assisted Preparation of Nanocrystalline Spinel Metal Oxides: Nickel Ferrite and Zinc Aluminate", Journal of Physical Chemistry C, Feb. 1, 2008, vol. 112, No. 5, pp. 1407-1414.

Ohta, R. et al., "Effect of PS-PVD production throughput on Si nanoparticles for negative electrode of lithium ion batteries", Journal of Physics D: Applied Physics, Feb. 2018, vol. 51(1), in 7 pages.

Olsvik, O., et al., "Thermal Coupling of Methane—A Comparison Between Kinetic Model Data and Experimental Data", Thermochimica Acta., vol. 232, No. 1, 1994, pp. 155-169.

Or, T. et al., "Recycling of mixed cathode lithium-ion batteries for electric vehicles: Current status and future outlook", Carbon Energy, Jan. 2020, vol. 2, pp. 6-43. URL: https://doi.org/10.1002/cey2.29.

Park et al. "Preparation of spherical WTaMoNbV refractory high entropy alloy powder by inductively-coupled thermal plasma", Materials Letters 255 (2019) 126513 (Year: 2019).

Popescu et al.. "New TiZrNbTaFe high entropy alloy used for medical applications" IOP Conference Series: Materials Science and Engineering 400. Mod Tech 2018 (2018), 9 pages.

Pulsation Reactors—Thermal Processing for Extraordinary Material Properties, retrieved from https://www.ibu-tec.com/facilities/pulsation-reactors/, retrieved on Mar. 18, 2023, pp. 5.

Reig, L. et al., "Microstructure and Mechanical Behavior of Porous Ti—6Al—4V Processed by Spherical Powder Sintering", Materials, Oct. 23, 2013, vol. 6, pp. 4868-4878.

Sastry, S.M.L. et al., "Rapid Solidification Processing of Titanium Alloys", Journal of Metals (JOM), Sep. 1983, vol. 35, pp. 21-28.

Savage, S. J. et al., "Production of rapidly solidified metals and alloys", Journal of Metals (JOM), Apr. 1984, vol. 36, pp. 20-33.

Seehra, M. S., et al., "Correlation between X-ray diffraction and Raman spectra of 16 commercial graphene-based materials and their resulting classification", Carbon N Y., 2017, vol. 111, pp. 380-384.

Sheng, Y. et al., "Preparation of Micro-spherical Titanium Powder by RF Plasma", Rare Metal Materials and Engineering, Jun. 2013, vol. 42, No. 6, pp. 1291-1294.

Sheng, Y. et al., "Preparation of Spherical Tungsten Powder by RF Induction Plasma", Rare Metal Materials and Engineering, Nov. 2011, vol. 40, No. 11, pp. 2033-2037.

SPHEROIDAL TITANIUM METALLIC POWDERS WITH CUSTOM MICROSTRUCTURES

RELATED APPLICATIONS

This application is a continuation of U.S. patent application Ser. No. 17/301,880, filed Apr. 16, 2021 (US Patent Publication No. 2021/0252599), which is a continuation of U.S. patent application Ser. No. 16/012,370, filed Jun. 19, 2018 (US Patent Publication No. 2018/0297122), which is a continuation in part of U.S. patent application Ser. No. 15/381,336 (US Patent Publication No. US 2017/0173699), which claims priority to and the benefit of U.S. Provisional Patent Application No. 62/268,186, filed Dec. 16, 2015. Each of the foregoing applications is incorporated herein by reference in its entirety.

TECHNICAL FIELD

The present disclosure is generally directed towards producing metal spheroidal powder products. More particularly, the present disclosure is directed towards techniques for producing metal spheroidal powder products (e.g., Ti powders, Ti alloy powders, Ti compound powders) using a microwave generated plasma.

BACKGROUND

An important aspect of preparing some forms of industrial powders is the spheroidization process, which transforms irregularly shaped or angular powders produced by conventional crushing methods, into spherical low-porosity particles. Spherical powders are homogenous in shape, denser, less porous, have a high and consistent flowability, and high tap density. Such powders exhibit superior properties in applications such as injection molding, thermal spray coatings, additive manufacturing, etc.

Creating spheroidal metallic powders, especially metallic powders containing Ti, can pose a number of challenges. Achieving the desired spheroidal shape, the desired level of porosity (e.g., no porosity to very porous, and the desired composition and microstructure can be difficult.

Conventional spheroidization methods employ thermal arc plasma described in U.S. Pat. No. 4,076,640 issued Feb. 28, 1978 and radio-frequency generated plasma described in U.S. Pat. No. 6,919,527 issued Jul. 19, 2005. However, these two methods present limitations inherent to the thermal non-uniformity of radio-frequency and thermal arc plasmas.

In the case of thermal arc plasma, an electric arc is produced between two electrodes generates a plasma within a plasma channel. The plasma is blown out of the plasma channel using plasma gas. Powder is injected from the side, either perpendicularly or at an angle, into the plasma plume, where it is melted by the high temperature of the plasma. Surface tension of the melt pulls it into a spherical shape, then it is cooled, solidified and is collected in filters. An issue with thermal arc plasma is that the electrodes used to ignite the plasma are exposed to the high temperature causing degradation of the electrodes, which contaminates the plasma plume and process material. In addition, thermal arc plasma plume inherently exhibit large temperature gradient. By injecting powder into the plasma plume from the side, not all powder particles are exposed to the same process temperature, resulting in a powder that is partially spheroidized, non-uniform, with non-homogeneous porosity.

In the case of radio-frequency inductively coupled plasma spheroidization, the plasma is produced by a varying magnetic field that induces an electric field in the plasma gas, which in turn drives the plasma processes such as ionization, excitation, etc. . . . to sustain the plasma in cylindrical dielectric tube. Inductively coupled plasmas are known to have low coupling efficiency of the radio frequency energy into the plasma and a lower plasma temperature compared to arc and microwave generated plasmas. The magnetic field responsible for generating the plasma exhibits a non-uniform profile, which leads to a plasma with a large temperature gradient, where the plasma takes a donut-like shape that exhibiting the highest temperature at the edge of the plasma (close to the dielectric tube walls) and the lowest temperature in the center of the donut. In addition, there is a capacitive component created between the plasma and the radio frequency coils that are wrapped around the dielectric tube due to the RF voltage on the coils. This capacitive component creates a large electric field that drives ions from the plasma towards the dielectric inner walls, which in turn leads to arcing and dielectric tube degradation and process material contamination by the tube's material.

To be useful in additive manufacturing or powdered metallurgy (PM) applications that require high powder flow, metal powder particles should exhibit a spherical shape, which can be achieved through the process of spheroidization. This process involves the melting of particles in a hot environment whereby surface tension of the liquid metal shapes each particle into a spherical geometry, followed by cooling and re-solidification. Also, spherical powders can be directly produced by various techniques. In one such technique, a plasma rotating electrode (PRP) produces high flowing and packing titanium and titanium alloy powders but is deemed too expensive. Also, spheroidized titanium and titanium alloys have been produced using gas atomization, which uses a relatively complicated set up an may introduce porosity to the powder. Spheroidization methods of irregular shape powders include TEKNA's (Sherbrook, Quebec, Canada) spheroidization process using inductively coupled plasma (ICP), where angular powder obtained from Hydride-Dehydride (HDH) process is entrained within a gas and injected though a hot plasma environment to melt the powder particles. However, this method suffers from non uniformity of the plasma, which leads to incomplete spheroidization of feedstock. The HDH process involves several complex steps, including hydrogenation dehydrogenation, and deoxidation before the powder is submitted to spheroidization. This process is a time consuming multi-step process, which drives up the cost of metal powders made through these methods.

From the discussion above, it is therefore seen that there exists a need in the art to overcome the deficiencies and limitations described herein and above.

SUMMARY

The shortcomings of the prior art are overcome and additional advantages are provided through the use of a microwave generated plasma torch and selecting and controlling cooling processing parameters to generate spheroidized metallic particles with a desired microstructure. Exemplary embodiments of the present technology are directed to spheroidal titanium (e.g., titanium and titanium alloy) particles and methods for preparing such particles.

In one aspect, the present disclosure relates to spheroidized particles including titanium. The spheroidized particles are prepared by a process including: introducing a titanium based feed material (e.g., feed material includes titanium, such as titanium particles or titanium alloy powders) including particles into a microwave plasma torch; melting and spheroidizing the feed material within a plasma generated by the microwave plasma torch; exposing the spheroidized particles to an inert gas; and setting one or more cooling processing variables to tailor the microstructure of the spheroidized particles including titanium. The above aspect includes one or more of the following features. In one embodiment, the titanium based feed material includes a titanium alloy. In another embodiment, the spheroidized particles are Ti Al6-V4 (i.e., Ti 6-4). In another embodiment, melting and spheroidizing of the feed material occurs within a substantially uniform temperature profile between about 4,000K and 8,000K. In another embodiment, the feed material has a particle size of no less than 1.0 micrometers and no more than 300 micrometers. In another embodiment, one or more cooling processing variables are set to create a martensitic microstructure in the spheroidized particles. In another embodiment, one or more cooling processing variables are set to create a Widmanstätten microstructure in the spheroidized particles. In another embodiment, one or more cooling processing variables are set to create an equiaxed microstructure in the spheroidized particles. In another embodiment, one or more cooling processing variables are set to create at least two regions, each region having a different microstructure. In another embodiment, the at least two regions include a core portion and a skin portion. In another embodiment, the skin portion has a microstructure that is different from the feed material's microstructure.

In another aspect, the present disclosure relates to a method of tailoring microstructure of spheroidized metallic particles. The method includes introducing a metal feed material including particles into a microwave plasma torch. The method also includes melting and spheroidizing the feed material within a plasma generated by the microwave plasma torch; exposing the spheroidized particles to an inert gas; and setting one or more cooling processing variables to tailor the microstructure of the spheroidized metallic particles. The above aspect includes one or more of the following features. In one embodiment, the metal feed material includes a titanium based feed material. In another embodiment, melting and spheroidizing of the feed material occurs within a substantially uniform temperature profile between about 4,000K and 8,000K. In another embodiment, the feed material has a particle size of no less than 1.0 micrometers and no more than 300 micrometers. In another embodiment, setting one or more cooling processing variables includes selecting and controlling a cooling gas flow rate. In another embodiment, setting one or more cooling processing variables includes selecting and controlling a residence time of the particles of feed materials within the plasma. In another embodiment, setting one or more cooling processing variables includes selecting and controlling a cooling gas composition. In another embodiment, the cooling gas composition is selected to provide high thermal conductivity. In another embodiment, one or more cooling processing variables are set to create a martensitic microstructure in the spheroidized particles. In another embodiment, one or more cooling processing variables are set to create a Widmanstätten microstructure in the spheroidized particles. In another embodiment, one or more cooling processing variables are set to create an equiaxed microstructure in the spheroidized particles. In another embodiment, one or more cooling processing variables are set to create at least two regions, each region having a different microstructure. In another embodiment, the at least two regions include a core portion and a skin portion. In another embodiment, the skin portion has a microstructure that is different from the feed material's microstructure.

In another aspect, the present disclosure relates to a method of modifying at least one of particle shape or microstructure of a titanium based feed stock. The method includes selecting a composition of the titanium based metal feed stock; determining a desired microstructure for a final product; selecting cooling process parameters based upon desired microstructure and composition of the titanium based metal feed stock; melting at least a surface portion of particles of the titanium based metal feed stock in a plasma having a substantially uniform temperature profile at between 4,000K and 8,000K to spheriodize the feed stock; exposing the spheroidized particles to an inert gas; and setting and applying the selected cooling processing parameters to create spheroidized particles with the desired microstructure. The above aspect includes one or more of the following features. In one embodiment, selecting the composition of the titanium based metal feed material includes determining an alloying composition of a titanium based feed stock source. In another embodiment, the particles of the titanium based metal feed stock have a particle size of no less than 1.0 micrometers and no more than 300 micrometers. In another embodiment, setting and applying the selected cooling processing parameters includes controlling a cooling gas flow rate. In another embodiment, setting and applying the selected cooling processing parameters include controlling a residence time of the particles of the titanium based metal feed stock in the plasma. In another embodiment, setting and applying the selected cooling processing parameters includes controlling a cooling gas composition. In another embodiment, the cooling gas composition is selected to provide high thermal conductivity. In another embodiment, the cooling processing parameters are selected to create a martensitic microstructure in the spheroidized particles. In another embodiment, the cooling processing parameters are selected to create a Widmanstätten microstructure in the spheroidized particles. In another embodiment, the cooling processing parameters are selected to create an equiaxed microstructure in the spheroidized particles. In another embodiment, the cooling processing parameters are selected to create at least two regions, each region having a different microstructure or crystal structure. The at least two regions can include a core portion and a skin portion. In another embodiment, the skin portion has a microstructure that is different from the feed stock's microstructure. In another embodiment, the titanium based metal feed stock has a α-phase crystal structure and the spheroidized particles includes one or more regions of a β-phase crystal structure. In another embodiment, the titanium based metal feed stock has a single phase structure and the spheroidized particles have a multiphase structure.

Embodiments of the above aspects may include one or more of the following features. The various spheroidized particles, processes used to create the spheroidized particles, and methods of producing metal or metal alloy powders in accordance with the present technology can provide a number of advantages. For example, the particles, processes for forming the particles and methods disclosed herein can be used in a continuous process that spheroidizes, and allows for control over the final microstructure of the particles. Such embodiments can reduce the cost of spheroidizing metal powders by reducing the number of processing steps, which in turn, reduces the energy per unit volume of processed material and can increase the consistency of the final product. Reduction in the number of processing steps also reduces the possibility for contamination by oxygen and other contaminants. Additionally, the continuous processes disclosed herein improve the consistency of the end products by reducing or eliminating variations associated with typical batch-based processing of particles. The present technology can achieve additional improvements in consistency due to the homogeneity and control of the energy source (i.e., plasma process). Specifically, if the plasma conditions are well controlled, particle agglomeration can be reduced, if not totally eliminated, thus leading to a better particle size distribution (on the same scale as the original feed materials).

In addition to the advantage of consistent end product, the present methods and resulting powders have the advantage of control and the ability to tailor the microstructure of the end product. While not wishing to be bound by theory, it is believed that the methods disclosed herein provide control over heating and cooling processing conditions. As a result, by controlling and, in some embodiments, monitoring, at least one cooling processing variable (e.g., cooling gas flow rate, residence time in cooling gas, and composition of cooling gas) a desired microstructure, which may be different from the original microstructure can be obtained. Further, novel multiphase microstructures can be created. That is, spheroidal particles can be processed by controlling heating and/or cooling conditions to create a core with one microstructure and a shell with a different microstructure. Some embodiments have the advantage of being able to modify or change the microstructure of the feed stock material to a desired microstructure, which may be a single phase or multiphase material.

Additional features and advantages are realized through the techniques of the present technology. The recitation herein of desirable objects or aspects which are met by various embodiments of the present technology is not meant to imply or suggest that any or all of these objects or aspects are present as essential features, either individually or collectively, in the most general embodiment of the present technology or in any of its more specific embodiments.

BRIEF DESCRIPTION OF THE DRAWINGS

The features and advantages of the present disclosure will be more fully understood from the following description of exemplary embodiments when read together with the accompanying drawings, in which.

DETAILED DESCRIPTION

Figure 1:
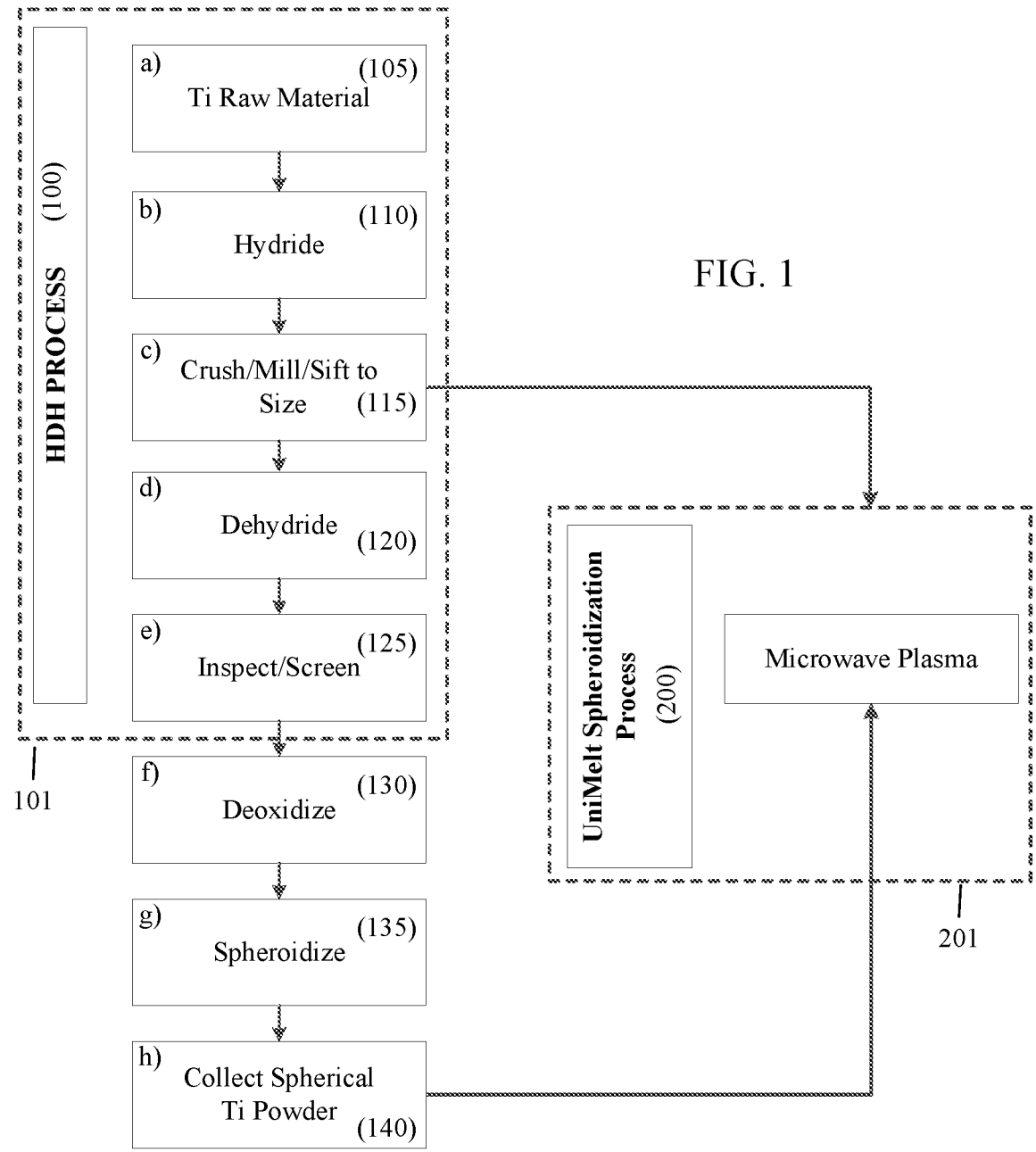
FIG. 1 illustrates an example method of producing spheroidal metallic and metallic alloy particles according to the present disclosure, compared against a conventional method for producing similar particles.

One aspect of the present disclosure involves a process of spheroidization of metals and metal alloy hydrides using a microwave generated plasma. The process uses readily available existing pre-screened or non-prescreened raw materials made of metal hydrides as feedstock. The powder feedstock is entrained in inert and/or reducing and/or oxidizing gas environment and injected into the microwave plasma environment. Upon injection into a hot plasma, the feedstock is simultaneously dehydrogenated and spheroidized and released into a chamber filled with an inert gas and directed into hermetically sealed drums where is it stored. This process can be carried out at atmospheric pressure, in a partial vacuum, or at a slightly higher pressure than atmospheric pressure. In alternative embodiments, the process can be carried out in a low, medium, or high vacuum environment. The process can run continuously and the drums are replaced as they fill up with spheroidized dehydrogenated and deoxidized metal or metal alloy particles. The process not only spheroidizes the powders, but also eliminates the dehydrogenation steps from the traditional process of manufacturing metal and metal alloy powders using Hydride-De-hydride (HDH) process, which leads to cost reduction. By reducing the number of processing steps and providing a continuous process, the possibilities for contamination of the material by oxygen and other contaminants is reduced. Furthermore, provided the homogeneity of the microwave plasma process, particle agglomeration is also reduced, if not totally eliminated, thus leading to at least maintaining the particle size distribution of the original hydride feed materials.

In the powdered metallurgy industry, the Hydride-Dehydride (HDH) process is used to resize large metallic or metallic alloy pieces down to a finer particle size distribution through crushing, milling, and screening. Metal and alloy powders are manufactured using the HDH process, where bulk feedstock, such as coarse metal powders or metal/metal alloy scraps, etc., are heated in a hydrogen-containing atmosphere at high temperature (~700° C.) for a few days. This leads to the formation of a brittle metal hydride, which can readily be crushed into a fine power and sifted to yield a desired size distribution determined by the end user. To be useful in powdered metallurgy, hydrogen must be dissociated and removed from the metal by heating the metal hydride powder within vacuum for a period of time. The dehydrogenated powder must then be sifted to remove large particle agglomerations generated during process due to sintering. The typical resulting powder particles have an irregular or angular shape. The powder is submitted to a deoxidation process to remove any oxygen picked up by the powder during sifting and handling. Conventional HDH processes produce only coarse and irregular shaped particles. Such HDH processes must be followed by a spheroidization process to make these particles spheroidal.

Conventional HDH processes are primarily carried out as solid-state batch processes. Typically, a volume of metal powder is loaded into a crucible(s) within a vacuum furnace. The furnace is pumped down to a partial vacuum and is repeatedly purged with inert gas to eliminate the presence of undesired oxygen. Diffusion of the inert gas through the open space between the powder particles is slow making it difficult to fully eliminate oxygen, which otherwise contaminates the final product. Mechanical agitation may be used to churn powder allowing for more complete removal of oxygen. However, this increases the complexity of the system and the mechanical components require regular maintenance, ultimately increasing cost.

Following oxygen purging the, hydrogenation may begin. The furnace is filled with hydrogen gas and heated up to a few days at high temperature to fully form the metal hydride. The brittle nature of the metal hydride allows the bulk material to be crushed into fine powders which are then screened into desired size distributions.

The next step is dehydrogenation. The screen hydride powder is loaded into the vacuum furnace then heated under partial vacuum, promoting dissociation of hydrogen from the metal hydride to form $H_2$ gas and dehydrided metal. Dehydrogenation is rapid on the particle surface where $H_2$ can readily leave the particles. However, within the bulk of the powder, $H_2$ must diffuse through the bulk of the solid before it reaches surface and leave the particle. Diffusion through the bulk is a rate-limiting process "bottle-neck" requiring relatively long reaction time for complete dehydrogenation. The time and processing temperatures required for dehydrogenation are sufficient to cause sintering between particles, which results in the formation of large particle agglomerations in the final product. Post-process sifting eliminates the agglomerations, which adds process time and cost to the final product. Before the powder can be removed from the furnace, it must be sufficiently cooled to maintain safety and limit contamination. The thermal mass of the large furnaces may take many hours to sufficiently cool. The cooled powders must then be spheroidized in a separate machine. Generally this is carried out within an RF plasma, which are known to exhibit large temperature gradients resulting in partially spheroidized products.

Techniques are disclosed herein for manufacturing spheroidal metal and metal alloy powder products in a continuous process that simultaneously dehydrogenates and spheroidizes feed materials. According to exemplary embodiments, the dehydrogenation and spheroidization steps of an HDH process can be simplified to a single processing step using a microwave generated plasma. Such embodiments can reduce the cost of spheroidizing metal powders by reducing the number of processing steps, reducing the energy per unit volume of processed material, and increasing the consistency of the final product. Reduction in the number of processing steps also reduces the possibility for powder contamination by oxygen and other contaminants. Additionally, the continuous dehydrogenation processes disclosed herein improves the consistency of the end products by reducing or eliminating variations associated with typical batch-based dehydrogenation processes.

The rate of cooling of the dehydrogenated, deoxidized, and spheroidized metal and metal alloys can be controlled to strategically influence the microstructure of the powder. For example, rapid cooling of α-phase titanium alloys facilitates an acicular (martensite) structure. Moderate cooling rates produce a Widmanstätten microstructure, and slow cooling rates form an equiaxed microstructure. By controlling the process parameters such as cooling gas flow rate, residence time, cooling gas composition etc., microstructure of the metal and metal alloys can be controlled. In general, process parameters such as power density, flow rates, and residence time of the powder in the plasma dependent on the powder material's physical characteristics, such as, for example, the melting point, thermal conductivity, and particle size distribution. In some embodiments, the power density can range from about 20 W/cm$^3$ to 500 W/cm$^3$. In certain embodiments, the total gas flow rate can range from about 0.1 cfm (cubic feet per minute) to 50 cfm. In embodiments, the residence time can be tuned from about 1 milliseconds to 10 seconds. The precise cooling rates required to form these structures is largely a function of the type and quantity of the alloying elements within the material.

The rate of cooling, especially when combined with the consistent and uniform heating capabilities of a microwave plasma plume, allow for control over the final microstructure. As a result, the above methods can be applied to processing metal (e.g., titanium and titanium alloys such as Ti 6-4) feed stock. In particular, while certain methods herein have described the use of a metal hydride feed stock, the control over microstructure is not limited thereto. In particular, methods of the present technology and powders created by the present technology include the use of non-hydrided sources. For example, titanium metal and various titanium metal alloys can be utilized as the feed stock source. These materials can be crushed or milled to create particles for treatment within a microwave plasma torch.

Cooling processing parameters include, but are not limited to, cooling gas flow rate, residence time of the spheroidized particles in the hot zone, and the composition or make of the cooling gas. For example, the cooling rate or quenching rate of the particles can be increased by increasing the rate of flow of the cooling gas. The faster the cooling gas is flowed past the spheroidized particles exiting the plasma, the higher the quenching rate-thereby allowing certain desired microstructures to be locked-in. Residence time of the particles within the hot zone of the plasma can also be adjusted to provide control over the resulting microstructure. That is, the length of time the particles are exposed to the plasma determines the extent of melting of the particle (i.e., surface of the particle melted as compared to the inner most portion or core of the particle). Consequently, the extent of melting effects the extent of cooling needed for solidification and thus it is a cooling process parameter. Microstructural changes can be incorporated throughout the entire particle or just a portion thereof depending upon the extent of particle melting. Residence time can be adjusted by adjusting such operating variables of particle injection rate and flow rate (and conditions, such as laminar flow or turbulent flow) within the hot zone. Equipment changes can also be used to adjust residence time. For example, residence time can be adjusted by changing the cross-sectional area of the hot zone. For instance, for the same gas flow rates, a larger cross-sectional area of the plasma torch and/or extension tube in an afterglow region (e.g., region about plasma 11 in FIG. 4, the cross-sectional area being at least partially defined by the inner wall) will lead to a lower particle velocity, whereas a smaller cross-sectional area will lead to a higher velocity, thus lowering residence time in the hot zone.

Another cooling processing parameter that can be varied or controlled is the composition of the cooling gas. Certain cooling gases are more thermally conductive than others. For example helium is considered to be a highly thermally conductive gas. The higher the thermal conductivity of the cooling gas, the faster the spheroidized particles can be cooled/quenched. By controlling the composition of the cooling gas (e.g., controlling the quantity or ratio of high thermally conductive gasses, such as helium, to lesser thermally conductive gases, such as argon) the cooling rate can be controlled.

As is known in metallurgy, the microstructure of a metal is determined by the composition of the metal and heating and cooling/quenching of the material. In the present technology, by selecting (or knowing) the composition of the feed stock material, and then exposing the feed stock to a plasm that has the uniform temperature profile and control there over as provided by the microwave plasma torch, followed by selecting and controlling the cooling parameters control over the microstructure of the spheroidized metallic particle is achieved. In addition, the phase of the metallic material depends upon the compositions of the feed stock material (e.g., purity, composition of alloying elements, etc.) as well thermal processing. Titanium has two distinct phases known as the alpha phase (which has a hexagonal close packed crystal structure) and a beta phase which has a body centered cubic structure. Titanium can also have a mixed α+β phase. The different crystal structures yield different mechanical responses. Because titanium is allotropic it can be heat treated to yield specific contents of alpha and beta phases. The desired microstructure is not only a description of the grains (e.g., martensitic vs. equiaxed) but also the amount and location of different phases throughout.

In one exemplary embodiment, inert gas is continually purged surrounding a powdered metal feed to remove oxygen within a powder-feed hopper. A continuous volume of powder feed is then entrained within an inert gas and fed into the microwave generated plasma for dehydrogenation or for composition/maintaining purity of the spheroidized particles. In one example, the microwave generated plasma may be generated using a microwave plasma torch, as described in U.S. Patent Publication No. US 2013/0270261, and/or U.S. Patent Publication No. US 2008/0173641 (issued as U.S. Pat. No. 8,748,785), each of which is hereby incorporated by reference in its entirety. In some embodiments, the particles are exposed to a uniform temperature profile at between 4,000 and 8,000 K within the microwave generated plasma. Within the plasma torch, the powder particles are rapidly heated and melted. Liquid convection accelerates $H_2$ diffusion throughout the melted particle, continuously bringing hydrogen ($H_2$) to the surface of the liquid metal hydride where it leaves the particle, reducing the time each particle is required to be within the process environment relative to bulk processes. As the particles within the process are entrained within an inert gas, such as argon, generally contact between particles is minimal, greatly reducing the occurrence of particle agglomeration. The need for post-process sifting is thus greatly reduced or eliminated, and the resulting particle size distribution could be practically the same as the particle size distribution of the input feed materials. In exemplary embodiments, the particle size distribution of the feed materials is maintained in the end products.

Within the plasma, the melted metals are inherently spheroidized due to liquid surface tension. As the microwave generated plasma exhibits a substantially uniform temperature profile, more than 90% spheroidization of particles could be achieved (e.g., 91%, 93%, 95%, 97%, 99%, 100%), eliminating the need for separate dehydrogenation steps. In embodiments, which do not include dehydrogenation, both spheroidization and tailoring (e.g., changing, manipulating, controlling) microstructure are addressed or, in some instances, partially controlled, by treating with the microwave generated plasma. After exiting the plasma, the particles are cooled before entering collection bins. When the collection bins fill, they can be removed and replaced with an empty bin as needed without stopping the process.

Embodiments of the present disclosure are directed to producing particles that are substantially spherical or spheroidal or have undergone significant spheroidization. In some embodiments, spherical, spheroidal or spheroidized particles refer to particles having a sphericity greater than a certain threshold. Particle sphericity can be calculated by calculating the surface area of a sphere $A_{s,ideal}$ with a volume matching that of the particle, V using the following equation:

$$r_{ideal} = \sqrt[3]{\frac{3V}{4\pi}}$$

$$A_{s,ideal} = 4\pi r_{ideal}^2$$

and then comparing that idealized surface area with the measured surface area of the particle, $A_{s,actual}$:

$$\text{Sphericity} = \frac{A_{s,ideal}}{A_{s,actual}}$$

In some embodiments, particles can have a sphericity of greater than 0.5, 0.6, 0.7, 0.75, 0.8, 0.9, 0.91, 0.95, or 0.99 (or greater than about 0.5, about 0.6, about 0.7, about 0.75, about 0.8, about 0.8, about 0.91, about 0.95, or about 0.99). In some embodiments, particles can have a sphericity of 0.75 or greater or 0.91 or greater (or about 0.75 or greater or about 0.91 or greater). In some embodiments, particles can have a sphericity of less than 0.5, 0.6, 0.7, 0.75, 0.8, 0.9, 0.91, 0.95, or 0.99 (or less than about 0.5, about 0.6, about 0.7, about 0.75, about 0.8, about 0.8, about 0.91, about 0.95, or about 0.99). In some embodiments, a particle is considered to be spherical, spheroidal or spheroidized if it has a sphericity at or above any of the aforementioned sphericity values, and in some preferred embodiments, a particle is considered to be spherical if its sphericity is at or about 0.75 or greater or at or about 0.91 or greater.

In some embodiments, a median sphericity of all particles within a given powder can be greater than 0.5, 0.6, 0.7, 0.75, 0.8, 0.9, 0.91, 0.95, or 0.99 (or greater than about 0.5, about 0.6, about 0.7, about 0.75, about 0.8, about 0.8, about 0.91, about 0.95, or about 0.99). In some embodiments, a median sphericity of all particles within a given powder can be less than 0.5, 0.6, 0.7, 0.75, 0.8, 0.9, 0.91, 0.95, or 0.99 (or less than about 0.5, about 0.6, about 0.7, about 0.75, about 0.8, about 0.8, about 0.91, about 0.95, or about 0.99). In some embodiments, a powder is considered to be spheroidized if all or a threshold percentage (as described by any of the fractions below) of the particles measured for the given powder have a median sphericity greater than or equal to any of the aforementioned sphericity values, and in some preferred embodiments, a powder is considered to be spheroidized if all or a threshold percentage of the particles have a median sphericity at or about 0.75 or greater or at or about 0.91 or greater.

In some embodiments, the fraction of particles within a powder that can be above a given sphericity threshold, such as described above, can be greater than 50%, 60%, 70%, 80%, 90%, 95%, or 99% (or greater than about 50%, about 60%, about 70%, about 80%, about 90%, about 95%, or about 99%). In some embodiments, the fraction of particles within a powder that can be above a given sphericity threshold, such as described above, can be less than 50%, 60%, 70%, 80%, 90%, 95%, or 99% (or less than about 50%, about 60%, about 70%, about 80%, about 90%, about 95%, or about 99%).

Particle size distribution and sphericity may be determined by any suitable known technique such as by SEM, optical microscopy, dynamic light scattering, laser diffraction, manual measurement of dimensions using an image analysis software, for example from about 15-30 measures per image over at least three images of the same material section or sample, and any other techniques.

Referring to FIG. 1, shown is a comparison of a conventional process for producing spheroidized titanium powder (100) versus a method (200) in accordance with the present technology. The process flow (101) on the left of FIG. 1 presents an example process that combines a HDH process (100) with spheroidization of titanium powders. The process starts with Ti raw material (step a, 105) that is hydrogenated (step b, 110), and then crushed and sifted to size (step c, 115). Pure titanium is recovered through dehydrogenation (step d, 120). It is then screened for agglomerations and impurities, and then sifted to the size specified by the customer (step e, 125). The powder then goes through a deoxidation step to reduce or eliminate oxygen that it picked up during the sifting and screening processes. Deoxidation is required especially for small particle sizes, such as particles below 50 microns, where the surface to volume ratio is substantial (step f, 130). The titanium particles are then spheroidized (step g, 135) and collected (step h, 140). A similar process can be used to create a Ti alloy, such as Ti 6-4, instead of pure titanium powder.

As discussed above, some embodiments of the present disclosure combine the dehydrogenation and spheroidization steps shown on the left side of FIG. 1 (101, 130, 135) in favor of a single step to produce spheroidized metals and/or metal alloys from corresponding hydride feedstock. An example of this technique is illustrated in the process flow (201) shown on the right side of FIG. 1. The method starts with a crushed and sifted metal hydride feed material (i.e., step c, 115, without performing the dehydride step). In this particular embodiment, the feed material is a titanium hydride powder, and the powder resulting from process 200 is a spherical titanium powder. (It is noted that process 200 can also be used with crushed and sifted metal alloy hydride feed material, such as titanium alloy hydride feed material, and the powder resulting from completion of process 200 is a spherical metal alloy powder, such as a spherical titanium alloy powder.) The powder is entrained within an inert gas and injected into a microwave generated plasma environment exhibiting a substantially uniform temperature profile between approximately 4,000 K and 8,000 K and under a partial vacuum. The hermetically sealed chamber process can also run at atmospheric pressure or slightly above atmospheric pressure to eliminate any possibility for atmospheric oxygen to leak into the process. The particles are simultaneously melted and dehydrogenated in the plasma, spheroidized due to liquid surface tension, re-solidifying after exiting the plasma (200). The particles are then collected in sealed drums in an inert atmosphere (140). Within the plasma, the powder particles are heated sufficiently to melt and cause convection of the liquid metal, causing dissociation of the hydrogen according to the reversible reaction where M=an arbitrary metal:

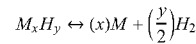

$$M_xH_y \leftrightarrow (x)M + \left(\frac{y}{2}\right)H_2$$

Within the partial vacuum, dissociation of hydrogen from the metal to form hydrogen gas is favored, driving the above reaction to the right. The rate of dissociation of hydrogen from the liquid metal is rapid, due to convection, which continually introduces $H_2$ to the liquid surface where it can rapidly leave the particle.

Figure 2:
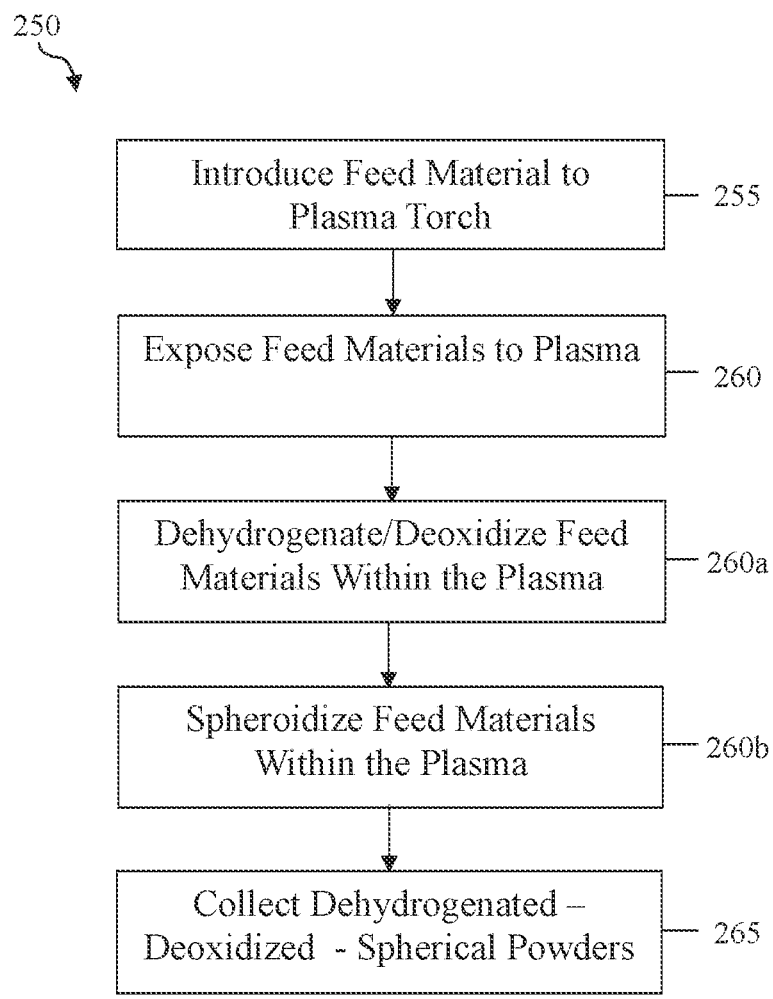
FIG. 2 illustrates another example method of producing dehydrogenated spheroidal particles according to the present disclosure.

FIG. 2 is a flow chart illustrating an exemplary method (250) for producing spherical powders, according to an embodiment of the present disclosure. In this embodiment, the process (250) begins by introducing a feed material into a plasma torch (255). In some embodiments, the plasma torch is a microwave generated plasma torch or an RF plasma torch. Within the plasma torch, the feed materials are exposed to a plasma causing the materials to melt, as described above (260). During the same time (i.e., time that feed material is exposed to plasma), hydrogen within the feed material dissociates from the metal, resulting in dehydrogenation (260a). Simultaneously the melted materials are spheroidized by surface tension, as discussed above (260b). Note that the step 260 includes 260a and 260b. That is, by exposing the feed material to the plasma both dehydrogenation and spheroidization are achieved; no separate or distinct processing steps are needed to achieve dehydrogenation and spheroidization. After exiting the plasma, the products cool and solidify, locking in the spherical shape and are then collected (265).

Figure 3:
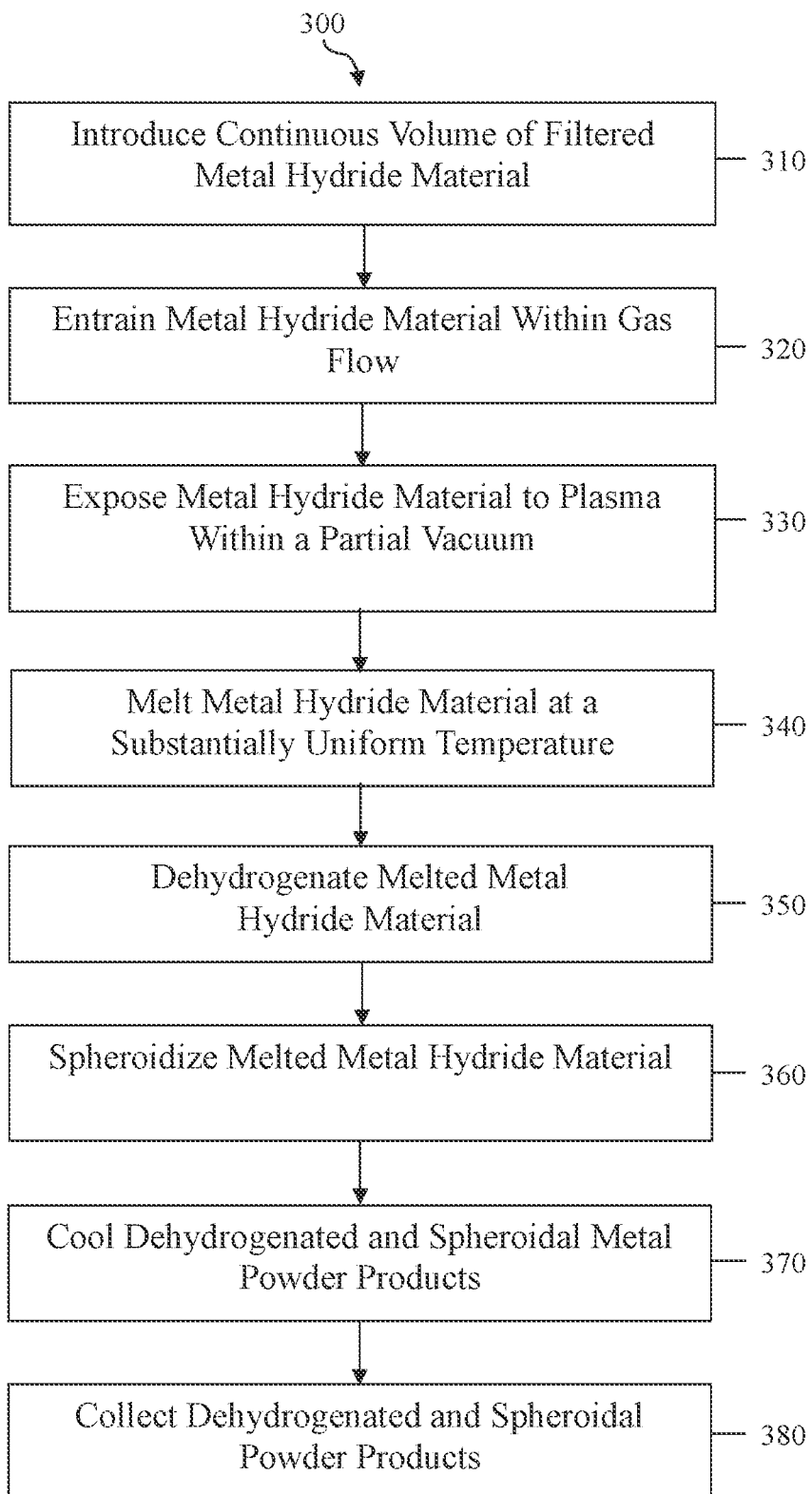
FIG. 3 illustrates another example method of producing dehydrogenated spheroidal particles from metal hydride material according to the present disclosure.

FIG. 3 is a flow chart illustrating another exemplary method (300) for producing spherical powders, according to another embodiment of the present disclosure. In this example, the method (300) begins by introducing a substantially continuous volume of filtered metal hydride feed materials into a plasma torch. As discussed above, the plasma torch can be a microwave generated plasma or an RF plasma torch (310). In one example embodiment, an AT-1200 rotating powder feeder (available from Thermach Inc.) allows a good control of the feed rate of the powder. In an alternative embodiment, the powder can be fed into the plasma using other suitable means, such as a fluidized bed feeder. The feed materials may be introduced at a constant rate, and the rate may be adjusted such that particles do not agglomerate during subsequent processing steps. In another exemplary embodiment, the feed materials to be processed are first sifted and classified according to their diameters, with a minimum diameter of 1 micrometers (µm) and a maximum diameter of 22 µm, or a minimum of 22 µm and a maximum of 44 µm, or a minimum of 44 µm and a maximum of 70 µm, or a minimum of 70 µm and a maximum of 106 µm, or a minimum of 106 µm and a maximum of 300 µm. As will be appreciated, these upper and lower values are provided for illustrative purposes only, and alternative size distribution values may be used in other embodiments. This eliminates recirculation of light particles above the hot zone of the plasma and also ensures that the process energy present in the plasma is sufficient to melt the particles without vaporization. Pre-screening allows efficient allocation of microwave power necessary to melt the particles without vaporizing material.

Once introduced into the microwave plasma torch, the feed materials can be entrained within an axis-symmetric laminar and/or turbulent flow toward a microwave or RF generated plasma (320). In exemplary embodiments, each particle within the process is entrained within an inert gas, such as argon. In some embodiments, the metal hydride materials are exposed to a partial vacuum within the plasma (330).

Within the plasma, the feed materials are exposed to a substantially uniform temperature profile and are melted (340). In one example, the feed materials are exposed to a uniform temperature profile of approximately between 4,000 and 8,000 K within the plasma. Melting the feed materials within the plasma brings hydrogen to the surface of the liquid metal hydride where it can leave the particle, thus rapidly dehydrogenating the particles (350). The $H_2$ acts as a reducing agent, which may simultaneously deoxidize the metal. Surface tension of the liquid metal shapes each particle into a spherical geometry (360). Thus, dehydrogenated and spherical liquid metal particles are produced, which cool and solidify into dehydrogenated and spherical metal powder products upon exiting the plasma (370). These particles can then be collected into bins (380). In some embodiments, the environment and/or sealing requirements of the bins are carefully controlled. That is, to prevent contamination or potential oxidation of the powders, the environment and or seals of the bins are tailored to the application. In one embodiment, the bins are under a vacuum. In one embodiment, the bins are hermetically sealed after being filled with powder generated in accordance with the present technology. In one embodiment, the bins are back filled with an inert gas, such as, for example argon. Because of the continuous nature of the process, once a bin is filled, it can be removed and replaced with an empty bin as needed without stopping the plasma process.

The methods and processes in accordance with the invention (e.g., 200, 250, 300) can be used to make spherical metal powders or spherical metal alloy powders. For example, if the starting feed material is a titanium hydride material, the resulting powder will be a spherical titanium powder. If the starting feed material is a titanium alloy hydride material, the resulting powder will be a spherical titanium alloy powder. In one embodiment that features the use of a starting titanium alloy hydride material, the resulting spherical titanium alloy powder comprises spherioidized particles of Ti Al6-V4, with between 4% to 7% weight aluminum (e.g., 5.5 to 6.5% Al) and 3% to 5% weight vanadium (e.g., 3.5 to 4.5% vanadium).

Figure 4:
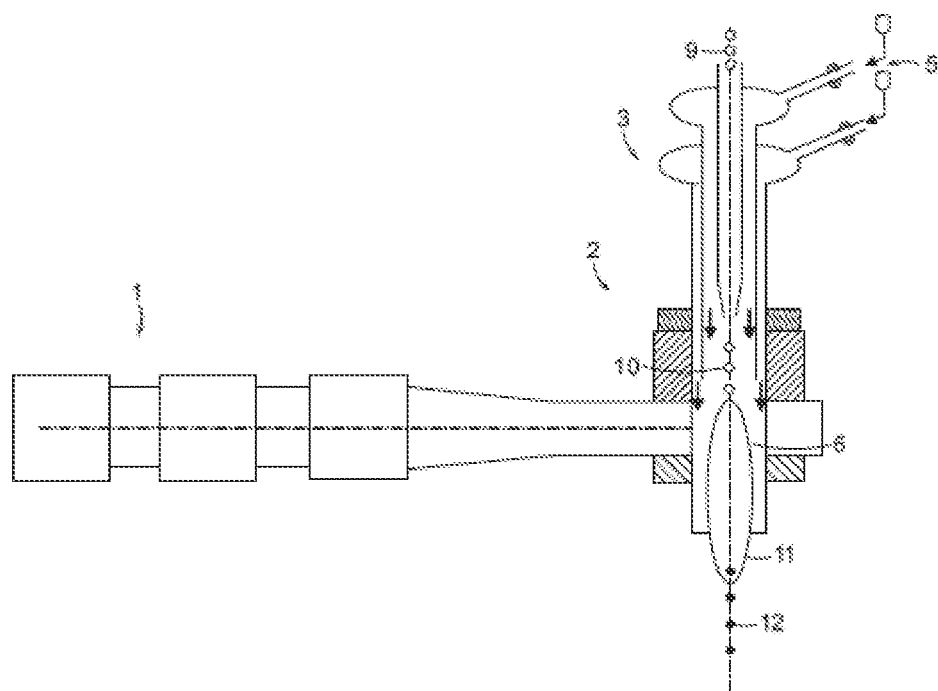
FIG. 4 illustrates an exemplary microwave plasma torch that can be used in the production of spheroidal and dehydrogenated metal or metal alloy powders, according to embodiments of the present disclosure.

FIG. 4 illustrates an exemplary microwave plasma torch that can be used in the production of spheroidal and dehydrogenated metal or metal alloy powders, according to embodiments of the present disclosure. As discussed above, metal hydride feed materials 9, 10 can be introduced into a microwave plasma torch 3, which sustains a microwave generated plasma 11. In one example embodiment, an entrainment gas flow and a sheath flow (downward arrows) may be injected through inlets 5 to create flow conditions within the plasma torch prior to ignition of the plasma 11 via microwave radiation source 1. In some embodiments, the entrainment flow and sheath flow are both axis-symmetric and laminar, while in other embodiments the gas flows are swirling. The feed materials 9 are introduced axially into the microwave plasma torch, where they are entrained by a gas flow that directs the materials toward the plasma. As discussed above, the gas flows can consist of a noble gas column of the periodic table, such as helium, neon, argon, etc. Within the microwave generated plasma, the feed materials are melted, as discussed above, in order to dehydrogenate and spheroidize the materials. Inlets 5 can be used to introduce process gases to entrain and accelerate particles 9, 10 along axis 12 towards plasma 11. First, particles 9 are accelerated by entrainment using a core laminar gas flow (upper set of arrows) created through an annular gap within the plasma torch. A second laminar flow (lower set of arrows) can be created through a second annular gap to provide laminar sheathing for the inside wall of dielectric torch 3 to protect it from melting due to heat radiation from plasma 11. In exemplary embodiments, the laminar flows direct particles 9, 10 toward the plasma 11 along a path as close as possible to axis 12, exposing them to a substantially uniform temperature within the plasma. In some embodiments, suitable flow conditions are present to keep particles 10 from reaching the inner wall of the plasma torch 3 where plasma attachment could take place. Particles 9, 10 are guided by the gas flows towards microwave plasma 11 were each undergoes homogeneous thermal treatment. Various parameters of the microwave generated plasma, as well as particle parameters, may be adjusted in order to achieve desired results. These parameters may include microwave power, feed material size, feed material insertion rate, gas flow rates, plasma temperature, residence time and cooling rates. In some embodiments, the cooling or quenching rate is not less than $10^{+3}$ degrees C./sec upon exiting plasma 11. As discussed above, in this particular embodiment, the gas flows are laminar; however, in alternative embodiments, swirl flows or turbulent flows may be used to direct the feed materials toward the plasma.

Figure 5:
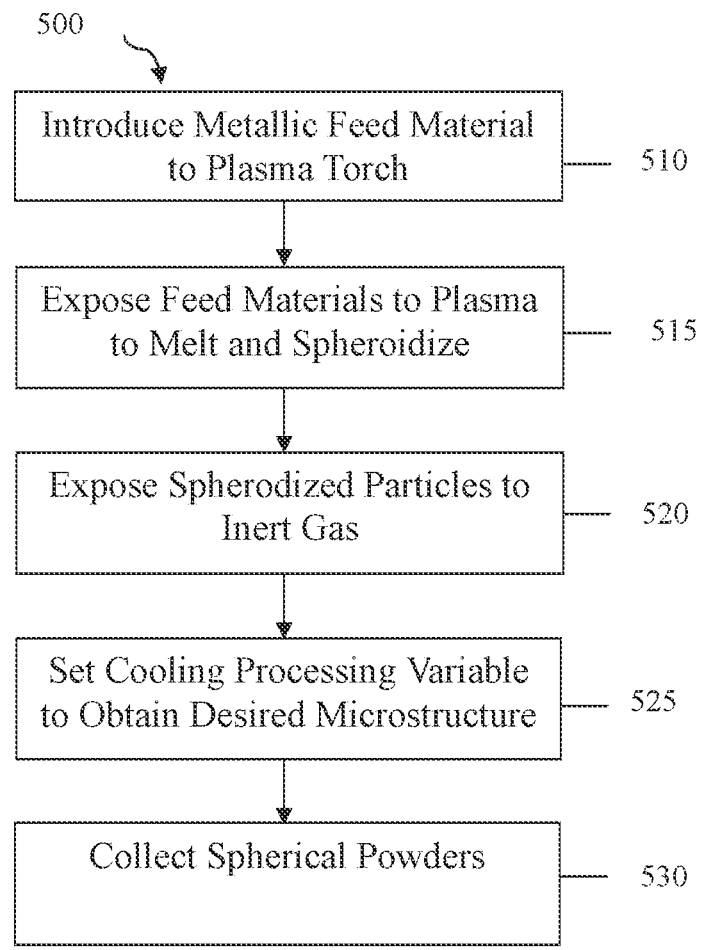
FIG. 5 illustrates an exemplary method of producing titanium based (e.g., titanium, titanium alloy) spheroidal particles having a desired microstructure.

FIG. 5 illustrates an exemplary method (500) of producing spheroidized titanium particles with a tailored or desired microstructure. Method 500 includes several processing steps to treat metallic feed materials such as, for example, titanium feed materials (e.g., titanium or titanium alloys) to create spheroidized metallic particles with a desired microstructure. In step 510, metallic (e.g., titanium based) feed materials comprising particles are feed into a plasma torch. The particles can be produced from crushing, pulverizing, or milling feed stock materials. In general, the feed stock particles have an average particle size of between 1 micron and 300 microns. In step 515, the feed stock particles are exposed to a microwave generated plasma to melt at least the surface portion of the particles. The melted portions of the particles allow for spheriodization of the particles. In step 520, the spheroidized particles are exposed to an inert gas such helium, nitrogen, argon or combinations/mixtures thereof. In step 525, the cooling processing variables/conditions are set and maintained to achieve a desired microstructure. For example, in embodiments in which a martensitic microstructure is desired throughout the entire particle, the cooling processing conditions are set for rapid cooling. As a result, the residence time of the particles in the hot zone is selected to allow for melting of the entire feedstock particle, the cooling gas flow rate is set to a fastest rate, and the amount of helium forming the composition of the cooling gas is set to a maximum available. After exposing the spheroidized particles to the selected cooling conditions, the spherical powders are collected in step 530.

Figure 6:
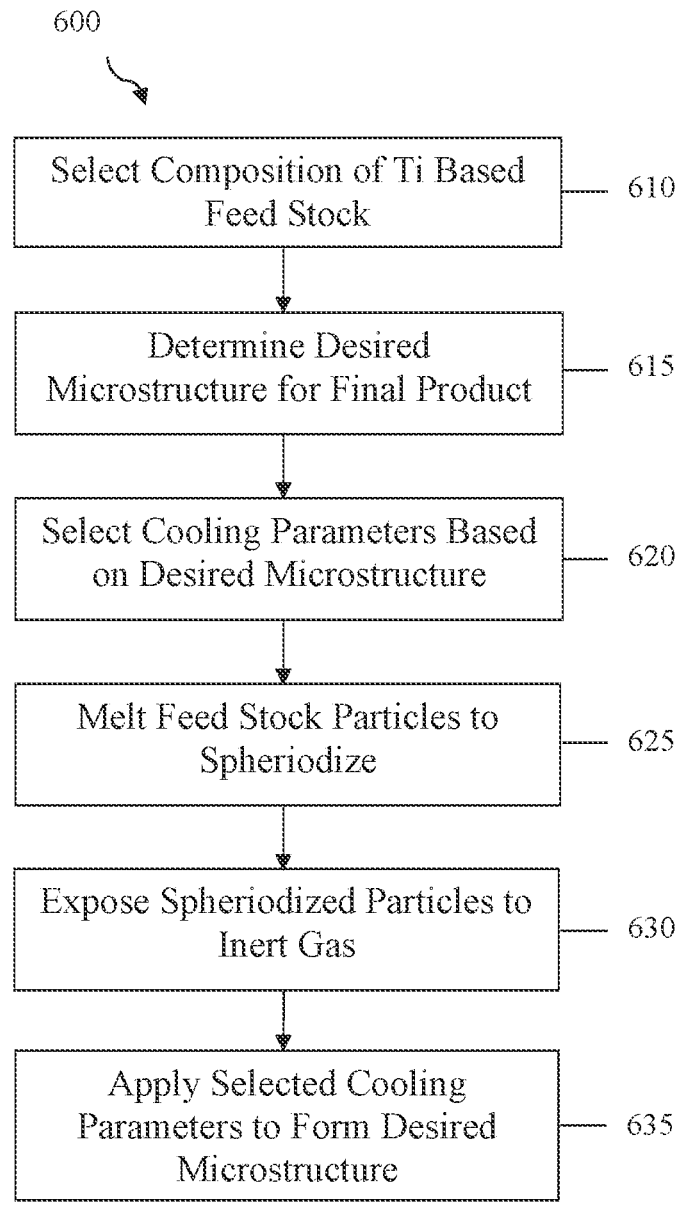
FIG. 6 illustrates an exemplary method of modifying a particle microstructure according to embodiments of the present disclosure.

FIG. 6 illustrates an exemplary method (600) of modifying metallic feed stock material to have a spheroidized shape and a desired microstructure. The method of 600 includes several processing steps to treat metallic feed materials such as, for example, titanium feed materials (e.g., titanium or titanium alloys) to create spheroidized metallic particles with a desired microstructure. In this method, knowledge of the chemical composition of the feed stock (e.g., 99.9% pure titanium, Ti-6Al-4V, etc.) is used in combination with control over thermal processing conditions to achieve spheroidal particles with a desired microstructure different than the metallic feed stock material. In step 610, the composition of the Ti-based feed stock material is selected or analyzed to determine its composition. In step 615, a desired microstructure of a final product is determined. For example, it may be determined that an α-phase 99% pure Ti equiaxed microstructure throughout the spheroidized particle is desired. As a result, a slower rate of cooling will be required than that used to produce a martensitic microstructure. Cooling processing parameters will be selected (step 620), such as cooling gas flow rate, residence time, and/or composition of cooling gas to achieve such a microstructure based upon the composition of the feed stock materials. In general, the microstructure of the final product will differ from the original feed stock material. That is an advantage of the present method is to be able to efficiently process feed materials to create spheroidized particles with a desired microstructure. After selecting or determining the cooling parameters, the feed stock particles are melted in the microwave generated plasma to spheriodize the particles in step 625. The spheroidized particles are exposed to an inert gas (step 630) and the determined or selected cooling parameters are applied to form the desired microstructure.

The desired microstructure of the spheroidized particle (end product) can be tailored to meet the demands and material characteristics of its use. For example, the desired microstructure may be one that provides improved ductility (generally associated with the α-phase). In another example, the desired microstructure may be associated with the inclusion of α+β phase or regions of α with islands of β phase or vice-versa. Without wishing to be bound by theory, it is believe that the methods of the present disclosure allow for control over the phase of the spheroidized particles as the microwave generated plasma has a uniform temperature profile, fine control over the hot zone, and the ability to select and adjust cooling processing parameters.

Figure 7:
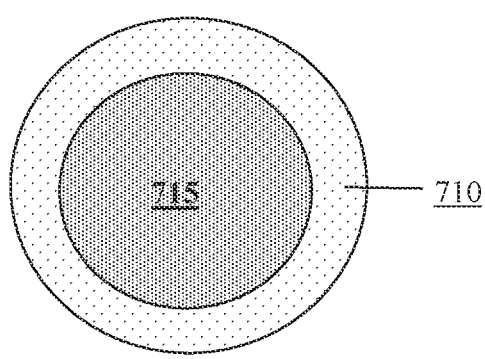
FIG. 7 illustrates an exemplary particle modified according to embodiments of the present disclosure.

Using the methods of the present technology, various microstructures, crystal structures and regions of differing microstructure and/or crystal structures can be produced. Accordingly, new spheroidal titanium particles can be produced efficiently. For example, due to the abilities to control the hot zone and cooling processing parameters, the present technology allows an operator to create multiple regions within the spheroidal particle. FIG. 7 shows such an embodiment. This figures illustrates a spheroidal particle which has two distinct regions. The outer or shell region 715 and an inner core 710. The original titanium feed material for this particle was a pure titanium α-phase powder. The feed material was exposed to the plasma under conditions (temperature, residence time, etc.) such that only a surface portion of the particle melted, so that spheroidization could occur. Cooling rates applied allowed for the transformation of the shell region to transform to β-phase, leaving the core to retain the α-phase.

In another embodiment, not shown, the entire feed stock particle can be melted and cooling parameters can be selected and applied to create a crystal structure that has the same phase as the feed stock material (e.g., retains α-phase) or is transformed to a new phase or mixture of phases. Similarly, cooling processing parameters can be selected and applied to create spheroidal particles that have the same microstructure throughout the particle or various microstructures in two or more regions (e.g., shell region, core region).

In describing exemplary embodiments, specific terminology is used for the sake of clarity and in some cases reference to a figure. For purposes of description, each specific term is intended to at least include all technical and functional equivalents that operate in a similar manner to accomplish a similar purpose. Additionally, in some instances where a particular exemplary embodiment includes a plurality of system elements, device components or method steps, those elements, components or steps may be replaced with a single element, component or step. Likewise, a single element, component or step may be replaced with a plurality of elements, components or steps that serve the same purpose. Moreover, while exemplary embodiments have been shown and described with references to particular embodiments thereof, those of ordinary skill in the art will understand that various substitutions and alterations in form and detail may be made therein without departing from the scope of the invention. Further still, other functions and advantages are also within the scope of the invention.

The invention claimed is:

1. A method of modifying a particle shape and a microstructure of a feedstock, the method comprising:
    melting at least a surface portion of particles of feedstock comprising titanium in a plasma to spheroidize the particles; and
    setting and applying cooling processing parameters to create spheroidized particles with a microstructure,
    wherein the cooling process parameters comprise one or more of a cooling gas flow rate, a residence time of the feedstock, and a cooling gas composition, and
    wherein the cooling processing parameters are selected to create at least two regions in the spheroidized particles, each region having a different microstructure or crystal structure, wherein the cooling processing parameters are selected to create an equiaxed microstructure in the spheroidized particles.

2. The method of claim 1, wherein the particles of the feedstock have a particle size of no less than 1.0 micrometers and no more than 300 micrometers.

3. The method of claim 1, wherein setting and applying the cooling processing parameters comprises controlling a cooling gas flow rate.

4. The method of claim 1, wherein setting and applying the selected cooling processing parameters comprises controlling a cooling gas composition.

5. The method of claim 1, wherein the at least two regions include a core portion and a skin portion.

6. The method of claim 5, wherein the skin portion has a microstructure that is different from the microstructure of the feedstock.

7. A method of modifying a particle shape and a microstructure of a feedstock, the method comprising:
    melting at least a surface portion of particles of the feedstock comprising titanium in a plasma to spheroidize the particles; and
    setting and applying cooling processing parameters to create spheroidized particles with a microstructure,
    wherein the cooling process parameters comprise one or more of a cooling gas flow rate, a residence time of the feedstock, and a cooling gas composition, and
    wherein the cooling processing parameters are selected to create a martensitic microstructure, a Widmanstätten microstructure, and/or an equiaxed microstructure in the spheroidized particles.

8. The method of claim 7, wherein the particles of the feedstock have a particle size of no less than 1.0 micrometers and no more than 300 micrometers.

9. The method of claim 7, wherein setting and applying the selected cooling processing parameters comprises controlling a cooling gas flow rate.

10. The method of claim 7, wherein setting and applying the selected cooling processing parameters comprises controlling a cooling gas composition.

11. The method of claim 7, wherein the cooling processing parameters are selected to create a martensitic microstructure in the spheroidized particles.

12. The method of claim 7, wherein the cooling processing parameters are selected to create a Widmanstätten microstructure in the spheroidized particles.

13. The method of claim 7, wherein the cooling processing parameters are selected to create an equiaxed microstructure in the spheroidized particles.

14. The method of claim 7, wherein the cooling processing parameters are selected to create at least two regions in the spheroidized particles.

15. The method of claim 14, wherein each region has a different microstructure or crystal structure.

16. The method of claim 14, wherein the at least two regions include a core portion and a skin portion.

17. The method of claim 16, wherein the skin portion has a microstructure that is different from the microstructure of the feedstock.

* * * * *